US010811373B2

(12) United States Patent
Zaman et al.

(10) Patent No.: US 10,811,373 B2
(45) Date of Patent: Oct. 20, 2020

(54) PACKAGING STRUCTURE COMPRISING AT LEAST ONE TRANSITION FORMING A CONTACTLESS INTERFACE

(71) Applicant: Gapwaves AB, Gothenburg (SE)

(72) Inventors: Ashraf Uz Zaman, Hisings Backa (SE); Jian Yang, Mölndal (SE); Uttam Nandi, Västra Frölunda (SE)

(73) Assignee: GAPWAVES AB, Gothenburg (SE)

( * ) Notice: Subject to any disclaimer, the term of this patent is extended or adjusted under 35 U.S.C. 154(b) by 0 days.

(21) Appl. No.: 16/339,011

(22) PCT Filed: Oct. 5, 2016

(86) PCT No.: PCT/SE2016/050949
§ 371 (c)(1),
(2) Date: Apr. 3, 2019

(87) PCT Pub. No.: WO2018/067046
PCT Pub. Date: Apr. 12, 2018

(65) Prior Publication Data
US 2020/0043875 A1    Feb. 6, 2020

(51) Int. Cl.
*H01L 23/66*    (2006.01)
(52) U.S. Cl.
CPC ...... *H01L 23/66* (2013.01); *H01L 2223/6633* (2013.01); *H01L 2223/6677* (2013.01); *H01L 2223/6683* (2013.01)
(58) Field of Classification Search
CPC ........... H01L 23/66; H01L 23/64; H01P 5/107
See application file for complete search history.

(56) References Cited

U.S. PATENT DOCUMENTS

| 5,923,225 A | 7/1999 | De Los Santos |
| 8,436,450 B2 * | 5/2013 | Menon ................ H01L 23/66 |
| | | 257/664 |

(Continued)

FOREIGN PATENT DOCUMENTS

| CN | 104 241 794 | 12/2014 |
| JP | H06 140816 | 5/1994 |

(Continued)

OTHER PUBLICATIONS

D1 Uz Zaman Ashraf et al: 11 Desi gn of a Simple Transition From Microstrip to Ridge Gap Waveguide Suited for MMIC and Antenna Integration, vol. 12, Dec. 5, 2013 (Dec. 5, 2013), pp. 1558-1561.

(Continued)

*Primary Examiner* — Changhyun Yi
(74) *Attorney, Agent, or Firm* — Jeffrey S. Melcher; Melcher Patent Law PLLC

(57) ABSTRACT

A packaging structure (100) having a split-block assembly with a first and a second conducting block section (10A, 20A) and at least one transition between a first planar transmission line (2A) and a second transmission line (11A), and one or more input/output ports. The first transmission line (2A) is arranged on a substrate disposed on the first conducting block section (10A) and has a coupling section (3A), a cavity (4A) with a cavity opening in an upper surface of the first conducting block section (10A), and the second transmission line (11A) being in line with the first transmission line (2A) and located on an opposite side of the opening of the cavity (4A).

24 Claims, 11 Drawing Sheets

(56) References Cited

U.S. PATENT DOCUMENTS

| | | | |
|---|---|---|---|
| 8,803,638 B2* | 8/2014 | Kildal | H01P 1/2005 333/185 |
| 9,577,308 B2* | 2/2017 | Li | H01L 24/49 |

FOREIGN PATENT DOCUMENTS

| | | |
|---|---|---|
| WO | 2011/109939 | 9/2011 |
| WO | 2016/116126 | 7/2016 |

OTHER PUBLICATIONS

D5 Uz Zaman Ashraf et al: "Prospective new PMC based Gap Waveguide shielding for microwave modules", 2014 International Symposium on Electromagnetic Compatibility, IEEE, Sep. 1, 2014 (Sep. 1, 2014), pp. 459-463.

International Search Report issued in PCT/SE2016/050949, dated Jun. 27, 2017, pp. 1-3.

Written Opinion issued in PCT/SE2016/050949, Jun. 27, 2017, pp. 1-7.

X1 T. P. Budka, "Wide-bandwidth millimeter-wave bond-wire interconnects," in IEEE Transactions on Microwave Theory and Techniques, vol. 49, No. 4, pp. 715-718, Apr. 2001.

X2 V. Vassilev et al., "Integrated front-ends up to 200 GHz," Microwave Workshop Series on Millimeter Wave Integration Technologies (IMWS), 2011 IEEE MTT-S International, Sitges, 2011, pp. 57-60.

X3 C. Kamfelt, H. Zirath, J. P. Starski and J. Rudnicki, "Flip chip assembly of a 40-60 GHz GaAs microstrip amplifier," Microwave Conference, 2004. 34th European, Amsterdam, The Netherlands, 2004, pp. 89-92.

X4 C. T. Wang et al., "Investigation of the Flip-Chip Package With BCB Underfill for W-Band Applications," in IEEE Microwave and Wireless Components Letters, vol. 24, No. 1, pp. 11-13, Jan. 2014.

X5 A.U. Zaman, M. Alexanderson, T. Vukusic and P.S. Kildal, "Gap Waveguide PMC Packaging for Improved Isolation of Circuit Components in High-Frequency Microwave Modules," in IEEE Transactions on Components, Packaging and Manufacturing Technology, vol. 4, No. 1, pp. 16-25, Jan. 2014.

X6 F. J. Schmückle, R. Doerner, G. N. Phung, W. Heinrich, D. Williams, and U. Arz, "Radiation, multimode propagation, and substrate modes in W-band CPW calibrations," in Microwave Conference (EuMC), 2011 41st European, 2011, pp. 297-300.

X7 Ad C.F. Reniers et.al., "The Influence of the Probe Connection on mm-Wave Antenna Measurements", IEEE Transactions on antennas and propagation, vol. 63, No. 9, Sep. 2015, pp. 3819-3825.

X8 P.-S. Kildal, E. Alfonso, A. Valero-Nogueira, E. Rajo-Iglesias, "Local metamaterial-based waveguides in gaps between parallel metal plates", IEEE Antennas and Wireless Propagation letters (AWPL), vol. 8, pp. 84-87, 2009.

X9 E. Rajo-Iglesias, P.-S. Kildal, "Numerical studies of bandwidth of parallel plate cut-off realized by bed of nails, corrugations and mushroom-type EBG for use in gap waveguides", IET Microwaves, Antennas & Propagation, vol. 5, No. 3, pp. 282-289, Mar. 2011.

* cited by examiner

PACKAGING STRUCTURE COMPRISING AT LEAST ONE TRANSITION FORMING A CONTACTLESS INTERFACE

TECHNICAL FIELD

The present invention relates to a packaging structure comprising at least one transition between a first transmission line and a second transmission line,
  said first transmission line being a planar transmission line,
  a split-block assembly with a first conducting block section and a second conducting block section and at least one input/output port,
  said first transmission line is arranged on a substrate or forms part of a circuit arrangement arranged on a substrate disposed on the first conducting block section and comprises or is connected to a coupling section,
  the first conducting block section further, for the, or each, transition, comprises a cavity with a cavity opening in an upper surface of the first conducting block section and said first transmission line is so arranged that the coupling section will be located in the cavity opening in an assembled state of the split-block assembly,
  said second transmission line being arranged in line with said first transmission line on an opposite side of the cavity opening for providing a transition between the said first and second transmission lines,
  the second conducting block section is arranged to act as a lid or a cover in an assembled state of the high frequency packaging structure,
  one of the conducting block sections is provided with a high impedance surface or an AMC surface arranged along or facing said first and second transmission lines at the transition, and
  there being a narrow gap between the high impedance surface or the AMC surface and an opposing surface of the other conducting block section in the assembled state of the split-block assembly at least in the transition region such that the, or each, transition between said first transmission line and said second transmission line being contactless without any galvanic contact between said first transmission line and said second transmission line.

The invention also relates to an interconnecting arrangement comprising a contactless transition.

The invention also relates to use of an interconnecting arrangement as in claim 33 for performing measurements on a device comprising an electronic circuit or a device under test (DUT)

BACKGROUND

The use of high frequencies, in the millimetre-wave and sub-millimetre-wave frequency bands, is receiving more and more attention. It is attractive to be able to use the millimetre or sub-millimetre wave frequency region, since in these frequency regions larger frequency bandwidths are available. Therefore transitions, or interconnects, between circuits and waveguides or antennas, between circuits and between waveguides are needed for many different purposes and applications. However, several problems are associated with the provisioning of such interfaces. Packages with good electrical performance, mechanical reliability and of low cost are crucial for high frequency applications. The conventional technologies for chip-to-chip interconnects are wire-bonding and flip-chip packaging.

Normally, for a transition between a waveguide and a circuit at such high frequencies, a separate probe transition is used to provide the interface between the waveguide and the circuit. The probe transition converts the waveguide TE10 mode to a microstrip or coplanar mode. The probe transition has to be sufficiently narrow to prevent leakage of waveguide modes into the circuit cavity. A leakage results in direct losses and appearance of resonances within the circuit cavity.

A separate probe transition however requires a bond-wire or a flip-chip connection. Also for chip-to-chip interconnects wire-bonding and flip-chip packaging is used.

A problem associated with wire-bonding at high frequencies is that wire inductances can be considerably high causing an impedance mismatch. Further, bond wires can radiate significantly above 70 GHz. Both these effects can lead to a degradation and even severely affect the performance. Further, since bond-wires at high frequencies may lead to impedance mismatch, and are inductive, the bandwidth will be limited. The circuits are packaged in a metal enclosure forming a cavity. The radiation from the bond wires can excite resonances inside this cavity. To suppress the resonances, a common measure has been to split the cavity in smaller cavities by using metal walls, and to put lossy absorbers inside the cavities. The total insertion loss of an integrated front-end, with typically three or four interconnected MMICs, can fluctuate from 3 dB up to 8 dB. In addition, reproducibility is difficult to achieve using bond-wiring techniques in the millimetre-wave frequency range due to errors in the location of bonding pads, mechanical tolerances of a bonded chip or substrate, and limited control of the wire loop shape and wire length. The bond-pad contact area of the circuit becomes very small at high frequencies and bonding often destroys the high-frequency pad, thus affecting the yield.

In order to improve the high frequency performance of a bond-wire interconnect, efforts have usually focused on reducing the length of the bond wire, and also reducing the chip-to-chip spacing. However, for manufacturing purposes, and allowing mechanical tolerances, longer bond-wires and wider chip-to-chip spacing are needed, as well as large bond pad sizes. Several attempts have been made to solve these problems. T. P. Budka, "Wide-bandwidth millimeter-wave bond-wire interconnects," in *IEEE Transactions on Microwave Theory and Techniques*, vol. 49, no. 4, pp. 715-718, April 2001, discloses a new type of interconnect topology that uses filter design techniques to create an 80 GHz five-stage low-pass filter bond-wire interconnect. This interconnect extends the bandwidth of fixed-length bond-wire interconnects, and therefore enables the use of significantly longer bond wires, as long as each chip has a filter-like compensation on the RF bonding pads.

In V. Vassilev et al., "Integrated front-ends up to 200 GHz," *Microwave Workshop Series on Millimeter Wave Integration Technologies (IMWS), 2011 IEEE MTT-S International*, Sitges, 2011, pp. 57-60, it is focused on minimizing the wire inductance instead of using tuning structures. This is done by placing a pair of additional wires connected to ground near the bond. Both these approaches result in a reduction of insertion losses.

However, such a connection still contributes with a substantial reactance at high frequencies, causing extra losses and reduction in the achievable bandwidth. A separate probe transition further complicates the packaging process as it requires additional steps associated with mounting and accurate alignment of the transition circuit with respect to the circuit, e.g. an MMIC.

Attempts to integrate the waveguide transition onto a circuit (e.g. an MIMIC) generally have not been successful since the waveguide transition has to be sufficiently narrow in order to prevent leakage of waveguide mode into the circuit (MMIC) cavity. The width of the waveguide transition needs to be below λ/4 for the highest frequency. The MMIC, however, in most cases, cannot be made sufficiently narrow, and thin, to prevent or decrease surface waves.

Flip-chip connections also are associated with several disadvantages. Due to the lack of a carrier, they cannot be easily replaced and they are not suitable for manual installation. Further, they require very flat mounting surfaces, which often is difficult to provide, and sometimes difficult to maintain as the boards are heated and cooled.

Compared with wire-bonding, the flip-chip interconnects are much shorter, which is an advantage since it significantly reduces parasitic effects at millimetre wave frequencies, but the short connections are very stiff, so the thermal expansion of the chip has to be matched to the supporting board or the connection may crack. The underfill material acts as an intermediate between the difference in Coefficient of Thermal Expansion of the chip and the board. Though, an advantage with flip-chip transitions is the lower attenuation of the bump transition compared to a corresponding bond wire. In addition, it is normally not needed to compensate for the inductance, as is usually the case for bond wire applications. The flip-chip transition is also inherently wideband due to the small parasitic currents related to the bumps.

However, upside-down chip mounting onto an underlying substrate involves other parasitic phenomena which can lead to performance degradation of an overall packaged millimetre-wave system. These unwanted phenomena include parasitic parallel plate modes and chip detuning effects. Depending on the design criteria of the bump height, 5-7% frequency detuning can occur due to flip-chip assembly. One approach to eliminate the parasitic parallel-plate modes is to add a resistive layer on the carrier as e.g. discussed in C. Karnfelt, H. Zirath, J. P. Starski and J. Rudnicki, "Flip chip assembly of a 40-60 GHz GaAs microstrip amplifier,"*Microwave Conference*, 2004. 34*th European*, Amsterdam, The Netherlands, 2004, pp. 89-92, but this will add significant extra losses. Also, the coefficient of thermal expansion mismatch between the chip and the substrate usually generates thermal stresses that fracture the flip-chip structure. In C. T. Wang et al., "Investigation of the Flip-Chip Package With BCB Underfill for W-Band Applications," in *IEEE Microwave and Wireless Components Letters*, vol. 24, no. 1, pp. 11-13, January 2014 it is shown that the use of underfills with low dielectric loss is essential to improve the mechanical strength and reliability of the flip-chip package.

Connections between a circuit and a transmission line based on flip-chip connections also involve large alignment problems, and misalignment may lead to the integration being ruined.

Thus, wire-bonding as well as flip-chip packaging suffer from several drawbacks at millimetre-wave frequencies and higher frequencies. Although attempts to improve the performance of these technologies have resulted in increased reliability and lower insertion loss, the losses are still unsatisfactorily high.

In A. U. Zaman, M. Alexanderson, T. Vukusic and P. S. Kildal, "Gap Waveguide PMC Packaging for Improved Isolation of Circuit Components in High-Frequency Microwave Modules," in *IEEE Transactions on Components, Packaging and Manufacturing Technology*, vol. 4, no. 1, pp. 16-25, January 2014, is disclosed that the use of gap waveguide technology is an effective packaging technique for mm-wave systems that exhibits a lower insertion loss compared to conventional packaging techniques. The circuits are packaged with a pin metal lid, or bed of nails, which works as a high impedance surface or AMC (artificial magnetic conductive) surface in a wide frequency band. The resulting PEC-PMC (Perfect Electric Conductor-Perfect Magnetic Conductor) parallel-plate waveguide creates a cut-off for the electromagnetic waves, in such way that the unwanted packaging problems due to substrate modes and cavity resonances are suppressed. Bond wires are however used for chip-to-chip interconnection.

Thus, several problems are associated with the provisioning of a transition between transmission lines, e.g. between a circuit and a waveguide or an antenna, or between circuits, and, so far, no solutions which are entirely satisfactory have been suggested.

Also, for performing measurements, e.g. on-wafer measurements, of wafer level RF electronic circuits, connections or transitions are used. Today so called ground-signal-ground (GSG) probes are used for such measurements. They are among other things used to measure electronic devices on-wafer before they are packaged. Such GSG-probes, however, are associated with several disadvantages, since many factors have an influence on the measurements. The GSG-probes are prone to positioning errors, they have a limited life-time and they radiate. Particularly at high frequencies there are severe problems associated with the use of GSG-probes for measurements. It is difficult to assure that an adequate connection really is established for each of the three pins (two pins should be connected to ground, and one e.g. to a microstrip), since the pads are small, about 25 μm, and it may be difficult to actually assure that there is a connection at all. Further, the repeatability is poor since there may be a different twist and a different pressure exerted for each connection operation, in addition to localisation problems.

Thus, with known measuring and calibration arrangements, accuracy, reliability and repeatability are not satisfactory and they leave a lot to desire. In addition, known GSG probes are expensive and difficult to handle. Thus, on-wafer measurements are essential for assessing circuit performance prior to dicing the wafer into chips, but for the reasons given above, they are often not very conclusive. Ideally, the circuits should show the same behaviour when characterized on-wafer and when measured as a diced/packaged chip, but in practice there are significant discrepancies, also due to interactions with neighbouring structures on the wafer, as well as the influence of the measurement-probe geometry itself.

The probe itself plays a key role in exciting parasitic phenomena during on-wafer measurements, and the packaging may introduce unwanted phenomena such as multimode propagation, substrate mode propagation and cavity modes, and all these can strongly distort the measurement result, as also discussed in F. J. Schmiickle, R. Doerner, G. N. Phung, W. Heinrich, D. Williams, and U. Arz, "Radiation, multimode propagation, and substrate modes in W-band CPW calibrations," in *Microwave Conference (EuMC)*, 2011 41*st European*, 2011, pp. 297-300. With state of the art GSG probes, it is very difficult to de-embed the effect of the probe itself and the packaging from the measurements. One proposed solution consists of a quasi-optical RF link between the VNA ports and a planar slot antenna that is monolithically integrated with the DUT (Device Under Test) (C. Caglayan, G. C. Trichopoulos, and K. Sertel, "Non-Contact Probes for On-Wafer Characterization of Sub-Millimeter-Wave Devices and Integrated Circuits," Microwave Theory and Techniques, IEEE Transactions on Microwave Theory and Techniques, vol. 62(11), pp. 2791-2801, 2014). This contactless arrangement is very bulky, the alignment of the quasi-optical subsystem of the probe setup is critical and the insertion losses are high.

For measuring antennas e.g. in the mm-wave range, the use of probes or connectors is associated with several problems. The pattern of the antenna cannot be de-embedded from all the unwanted radiation from the probes or connectors. Structures supporting the antenna and the probe or connector cause a strong interference on the measured antenna pattern. In addition, as a result of the discontinuity due to the transition between probe tip and microstrip line, a probe will radiate considerably, influencing and degrading the signal-to-noise ratio, the dynamic range. This is e.g. discussed in Ad C. F. Reniers et. al., "The Influence of the Probe Connection on mm-Wave Antenna Measurements", IEEE Transactions on antennas and propagation, vol. 63, No. 9, September 2015, pp. 3819-3825.

Thus, there is also a strong need for an improved measuring arrangement for measuring particularly of high frequency circuit devices and even more particularly for performing measurements of on-chip antennas.

SUMMARY

It is therefore an object, in the most general aspect of the present invention, to provide a transition arrangement or an interconnect for interconnection of any planar transmission line with any other transmission line or waveguide through which one or more of the above mentioned problems are overcome.

It is particularly an object of the present invention to provide a packaging structure as initially referred to through which one or more of the above mentioned problems can be solved.

Particularly it is an object of the present invention to provide a high frequency packaging structure through which the need to use bond-wire connections or flip-chip connections at the high frequency port(s) can be avoided, and particularly through which losses due to the presence of bond-wires and galvanic contact can be reduced or avoided.

Particularly it is an object of the present invention to provide an improved packaging structure with one or more interconnects or transitions.

It is a particular object to provide high frequency packaging structure having a high, optimized, yield not affected by bonding onto small bond-pad areas.

It is further an object to provide a high frequency packaging structure which is easy and cheap to fabricate, and which allows assembly in a fast and easy manner, for example using a pick-and-place machine.

Particularly it is an object to provide a packaging structure with a good electrical performance and which has a good mechanical reliability.

It is also an object to provide a packaging structure comprising one or more transitions which is wideband and which has low insertion losses.

It is a particular object to provide a high frequency packaging structure which can be used for high frequencies, e.g. above 67 GHz or considerably higher, but also for lower frequencies, without any risk of leakage of undesired waveguide modes into the circuit arrangement arranged on a chip, e.g. an MMIC.

It is another particular object to provide a packaging structure with a transition arrangement which can be used for different frequencies, from very low frequencies up to very high frequencies, or for microwaves up to sub-millimetre waves.

A most particular object is to provide a packaging structure comprising one or more transitions which can be used for different circuit arrangements arranged on a substrate, passive as well as active, one or more MMICs, also large MMICs, and even more generally, circuits of many different kinds including hybrid circuits, RF circuits, operating at millimetre, sub-millimetre wave or microwave frequencies.

It is also an object to provide a packaging structure with a transition arrangement which is reliable and precise in operation.

Still further a particular object is to provide a packaging structure comprising one or more transitions or interconnects between a circuit arrangement, e.g. an MIMIC, and a waveguide, between circuit arrangements, e.g. between MMICs or PCBs, between a circuit arrangement and a chip antenna, or a waveguide and a chip antenna through which one or more of the above mentioned problems can be overcome.

Therefore a packaging structure as initially referred to is provided.

It is also an object to provide an interconnecting arrangement through which one or more of the above mentioned problems are overcome and through which measurements are facilitated and through which more accurate measurement results can be obtained than with hitherto known arrangements. Most particularly it is an object to provide an interconnecting arrangement allowing reliable and accurate on-wafer measurements of devices to be tested. Particularly it is an object to provide an interconnecting arrangement which is reliable, accurate and robust, and which provides a good repeatability, and further which is easy to set up and use. Further it is a particular object to provide an improved an interconnecting arrangement which is less sensitive to positioning errors than known probes, which has a long lifetime, is user-friendly and which is flexible in use.

Therefore an interconnecting arrangement as initially referred to is provided.

Still further it is an object to provide a use of such an interconnecting arrangement for measuring and/or calibrating circuits or electronic devices, on-chip antennas, particularly for performing on-wafer measurements, which is reliable, accurate, and robust and provides a good measurement repeatability.

Advantageous embodiments are given by the respective appended dependent claims.

It is an advantage of the inventive concept that interconnection problems associated with interconnection of circuit arrangements and waveguides, circuit arrangements and other circuit arrangements and with interconnection with e.g. chip antennas are overcome. Furthermore it is an advantage that bond wiring of high-speed signal lines is not needed and that a contactless interconnect concept is provided.

It is also an advantage that measurements of electronic devices and on-chip antennas are facilitated and that reliable, accurate measurements are enabled.

BRIEF DESCRIPTION OF THE DRAWINGS

The invention will in the following be further described in a non-limiting manner, and with reference to the accompanying drawings, in which.

DETAILED DESCRIPTION

Figure 1:
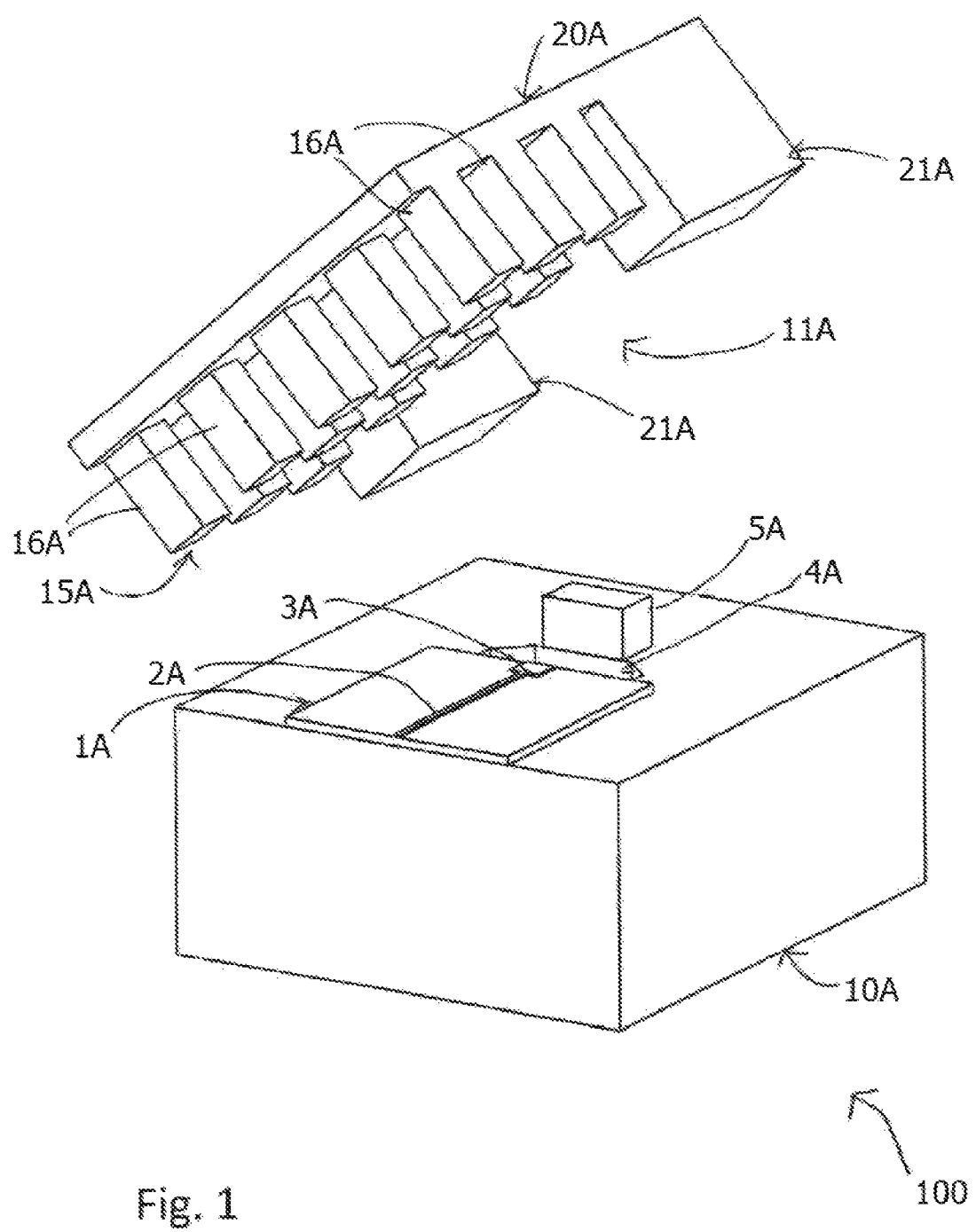
FIG. 1 is a view in perspective of a packaging structure, in a non-assembled state, according to a first embodiment which comprises a transition between a circuit arrangement, an MMIC, and a rectangular waveguide.

FIG. 1 schematically illustrates a packaging structure 100 according to a first embodiment of the invention which comprises an interconnection arrangement comprising a transition between a first transmission line being a microstrip line 2A of an MMIC 1A, and a rectangular waveguide 11A. The packaging structure 100 comprises a waveguide split block assembly in which the rectangular waveguide 11A is formed by a first conducting block or plate section 10A (here a bottom block), e.g. of solid metal or with a metalized surface, a second conducting, e.g. metal, block or plate section 20A (here a top metal block) and longitudinal conducting, block connecting sections or side walls 21A,21A, e.g. of metal or metalized, connected to, or, here, integral with, the second conducting block section 20A at the waveguide section of the packaging structure 100. Alternatively they can be connected to, or integral with, the first block section.

The packaging structure 100 as referred to above comprises a first transmission line which comprises a microstrip line 2A of a circuit arrangement provided on a substrate, here an MIMIC 1A. The MMIC 1A is integrated in the waveguide split block assembly formed by the first and second conducting block sections 10A,20A. The microstrip line 2A at an end is provided with a coupling section 3A for coupling the EM (electro-magnetic) field from the mictrostrip line 2A to the second transmission line in the transition, here the rectangular waveguide 11A.

The split-block assembly is provided with at least one high impedance surface 15A or an AMC surface, e.g. comprising a periodic or a quasi-periodic structure, which here is formed by a plurality of pins 16A forming a pin-bed. In the embodiment of FIG. 1 the high impedance surface 15A is provided on the second block section 20A.

On the first block section 10A the substrate with the MMIC 1A is disposed at an end opposite to the waveguide section 11A, and the coupling section 3A of, or connected to, the microstrip line 2A is located at the end portion of the MMIC 1A facing the waveguide section.

The first block section 1A comprises a cavity 4A arranged to act as a half-wavelength resonator for the transition between the MMIC 1A microstrip line 2A and the rectangular waveguide 11A. The MMIC with the microstrip line coupling section 3A is so arranged with respect to the cavity 4A that the coupling section 3A will be located in, or above, the opening of the cavity 4A, in the shown embodiment it is located substantially at the centre of the cavity 4A opening in the plane of the upper surface of the first block section 10A which will face the bottom section of the second block section 20A provided with the high impedance surface 15A in an assembled state of the split block assembly. It should however be clear that the coupling section can be located anywhere in the cavity opening.

At an end of the cavity 4A opening which is on the opposite side with respect to the end where the first transmission line 2A with the coupling section 3A is located, the second transmission line comprising the rectangular waveguide 11A or the waveguide section is provided. Preferably an impedance matching element 5A, e.g. a block such as a capacitive iris, is disposed at the end of the waveguide section 11A in the first block section 10A, adjacent the cavity 4A. Such an impedance matching element is not necessary for the functioning of the inventive concept, but serves the purpose of increasing the operational bandwidth.

The cavity or the hole has a depth of about $\lambda_g/4$, i.e. substantially a quarter wavelength. The cavity 4A may substantially have an arbitrary shape. The cavity 4A may e.g. have a rectangular, circular, square-shaped, elliptical cross-section. One or more of the dimensions of the cavity 4A, e.g. the length defined as the dimension of the cavity in a direction orthogonal to the longitudinal extension of the waveguide 11A, or perpendicularly to the transition, should be of the order of size of $\lambda_g/2$.

In the shown embodiment the cavity 4A has a polygonal shape, here hexagonal. Through a polygonal shape, a wider bandwidth for the transition is provided.

The cavity 4A will act as a half wavelength resonator, and the coupling section 3A with the microstrip line 2A is used as an input/output for the cavity 4A. Using the proper coupling section, it is possible to excite the cavity 4A in such a way that all RF power is delivered from the microstrip input to the cavity 4A, and from the cavity 4A output the RF power is delivered to the coupling section 3A. The output coupling section 3A may e.g. be a waveguide or a second microstrip line.

For illustrative purposes the split-block assembly is shown in a non-assembled state. In an assembled state the first and second conducting block sections 10A,20A are interconnected or mounted e.g. by means of screws, bolts, magnetic elements or any other appropriate connecting elements (not shown) via block connecting sections or side walls 21A,21A, here integral with the second conducting block section 20A. The block connecting sections or side walls 21A,21A will then rest on, and be in contact with, upper surface contact sections of the first block section 10A, and such that there will be a narrow gap g between the high impedance surface 15A, i.e. between the section of the second block section 20A comprising the high impedance surface 15A, e.g. the outer free ends of the pins 16A or similar, and the transition, the coupling section 3A, the MMIC 1A and the cavity 4A provided in the first block section 10A which acts as a half wavelength resonator, see above, or a resonant cavity in an assembled state of the split-block assembly, for preventing leakage of undesired waveguide modes. The gap is here the gap between the high impedance surface 15A and the upper surface of the MMIC 1A; although it could also be the gap between the high impedance surface and the surface of the first block section 10A in a transition region (see FIG. 3), since the thickness of the substrate normally is much smaller, e.g. in the order of 50 µm, whereas the gap is of the order of size of 250 µm. It should be clear that these figures merely are given for illustrative purposes for indicating an approximate relationship between the thickness of a substrate and the gap.

The second conducting block section 20A is arranged to act as a lid or a cover in an assembled state of the packaging structure 100, and the transition of the interconnecting arrangement is hence contactless, without any galvanic contact between the first transmission line 2A, the coupling section 3A or the MIMIC 1A, and the second transmission line here comprising a waveguide 11A.

The first and second conducting block sections 10A,20A may be adapted to be mountable/demountable, e.g. releasably interconnectable by means of the interconnecting means such as screws or similar, and hence possible to assemble/disassemble. Alternatively the first and second conducting block sections 10A,20A are not releasably interconnectable. Alignment means are optionally being provided for assisting in aligning the first and second conducting block sections 10A,20A when assembled.

The MMIC 1A comprises a dielectric substrate and the substrate preferably is intact, i.e. not shaped to have an opening corresponding to the opening of the cavity 4A. Alternatively the substrate comprises may be shaped to have a corresponding opening or a hole substantially of the same planar dimensions as the opening of the cavity 4A which is co-located therewith, or be shaped in any other appropriate manner as long as it comprises a protruding portion located below the coupling section 3A. Generally, however, it is easier to fabricate a substrate which is not shaped in any particular manner but has a substantially regular shape.

The high impedance surface 15A or the AMC surface here comprises a periodic or a quasi-periodic structure comprising a pin structure with a plurality of pins 16A of metal which are arranged to form a bed of pins, the periodic or a quasi-periodic structure being located at a slight distance, the gap g, which is smaller, or much smaller, than $\lambda_g/4$, from the transition region in the first conducting block section 10A, e.g. at a distance of approximately $\lambda_g/10$. The pins 16A of the periodic or quasi-periodic structure 15A have dimensions and are arranged such as to be adapted for a specific, selected, frequency band, and to block all other waveguide modes.

The presence of the gap g, e.g. filled with air, or filled with gas, vacuum, or at least partly with a dielectric material, between the high impedance surface 15A and the transition region, and the MMIC 1A, is allowed since the periodic or quasi-periodic structure stops all kind of wave propagation between the two surfaces in all other directions than desired paths. The periodic or quasi-periodic structure 15A, also called texture, is, as also referred to above, so designed that it stops propagation of waves inside the gap g in any direction, whereas waves are allowed to pass across the gap in the intended frequency band of operation. Thus, the shapes and dimensions and the arrangement of e.g. pins, posts, grooves, ridges etc. of the periodic or quasi-periodic structure are selected such as to prevent propagation of waves in any other direction than the intended direction.

The non-propagating or non-leaking characteristics between two surfaces of which one is provided with a periodic texture (structure), is known from P.-S. Kildal, E. Alfonso, A. Valero-Nogueira, E. Rajo-Iglesias, "Local metamaterial-based waveguides in gaps between parallel metal plates", IEEE Antennas and Wireless Propagation letters (AWPL), Volume 8, pp. 84-87, 2009 and several later publications by these authors. The non-propagating characteristic appears within a specific frequency band, referred to as a stopband. Therefore, the periodic texture and gap size must be designed to give a stopband that covers with the operating frequency band. It is also known that such stopbands can be provided by other types of periodic structures, as described in E. Rajo-Iglesias, P.-S. Kildal, "Numerical studies of bandwidth of parallel plate cut-off realized by bed of nails, corrugations and mushroom-type EBG for use in gap waveguides", IET Microwaves, Antennas & Propagation, Vol. 5, No 3, pp. 282-289, March 2011. These stopband characteristics are also used to form so called gap waveguides as described in Per-Simon Kildal, "Waveguides and transmission lines in gaps between parallel conducting surfaces", patent application No. PCT/EP2009/057743, 22 Jun. 2009.

It should be emphasized that any of the periodic or quasi-periodic textures previously used or that will be used in gap waveguides also can be used in a high frequency packaging structure of the present invention, and are covered by the patent claims.

According to the present invention, the two surfaces, e.g. the textured structure of the second block section 20A, the high impedance surface 15A, i.e. the plane formed by the free outer ends of the pins 16A, ridges or similar of a periodic or quasiperiodic structure, and the surface of the first block section 10A comprising the first planar transmission line, here the microstrip line 2A of the MMIC 1A, (or another textured surface as will be further discussed below) and the transition region, must not be separated more than a quarter of a wavelength of a transmitted signal, or rather have to be separated less than a quarter wavelength. This is thoroughly described in the above-mentioned publications, such as in particular in E. Rajo-Iglesias, P.-S. Kildal, "Numerical studies of bandwidth of parallel plate cut-off realized by bed of nails, corrugations and mushroom-type EBG for use in gap waveguides", IET Microwaves, Antennas & Propagation, Vol. 5, No 3, pp. 282-289, March 2011.

The high impedance surface, particularly the periodic or quasi-periodic structure 15A comprising pins 16A, may as referred to above be provided for in many different manners. In one embodiment pins are glued onto the second block section 20A. Alternatively pins may be soldered onto the surface of second block portion 20A. Still further a high impedance surface may be provided through milling and comprise pins, ridges, corrugations or other similar elements forming a periodic or quasi-periodic structure. The pins or similar may of course also have other cross-sectional shapes than square shaped; rectangular, circular etc. Also the dimensions are of course not limited to the exemplifying figures indicated for exemplary reasons below but may vary as also discussed below. Since the high impedance surface 15A prevents propagation of any undesired waveguide modes into the MMIC, the existence of any cavity modes in the circuit are prevented. The width, or cross-sectional dimension/the height of the pins, corrugations or other elements of any appropriate kind, is determined by the desired signal frequency band. The higher the frequency band, the smaller the dimensions, and the dimensions scale linearly with the wavelength; the higher the frequency, the smaller the wavelength $\lambda$, and the smaller the dimensions. For a frequency band, $\lambda$ is the wavelength of the centre frequency of the corresponding frequency band. Typically $\lambda_g$ is associated with a frequency in the centre of the operational bandwidth.

The plurality of metallic pins 16A are disposed in rows, at least partly in parallel. Just above the cavity 4A but two rows are needed, but the invention is not limited thereto, there may in some embodiments be but one row just above the cavity, or more than two rows.

The high impedance surface 15A in one embodiment comprises an array of pins 16A with a cross section e.g. having the dimensions of about $0.1\lambda$-$0.2\lambda$, in advantageous embodiments about $0.15\lambda \times 0.15\lambda$, and a height H of $0.15\lambda$-$0.3\lambda$, in particularly advantageous embodiments about $0.25\lambda$. Preferably the pin period is smaller than $\lambda/4$, although it may be smaller and larger as well. As an example the pins may have a width of about 0.4 mm, the distance between pins may be about 0.3 mm, and the periodicity may be about 0.7 mm. It should be clear that these figures are merely given for illustrative purposes, the figures may be larger as well as smaller, and also the relationships between the dimensions may be different.

The thickness of the MMIC substrate may e.g. be between 0.07 mm and 0.15 mm, although also other thicknesses can be used. The transition according to the present invention is very robust and suitable for different substrate thicknesses. The permittivity of the substrate is e.g. between 3 and 13, although these figures are merely given for exemplifying purposes and by no means for limiting purposes.

By means of the high impedance undesired modes are blocked from leaking across the transition into the MMIC from the waveguides and no power in form of a waveguide mode can propagate between the waveguide and the MMIC and vice versa, and it prevents the existence of the E-field perpendicularly to the surface, and no bond wires or flip-chips have to be used at high RF-frequencies, and the RF performance and the yield are considerably enhanced.

Figure 2:
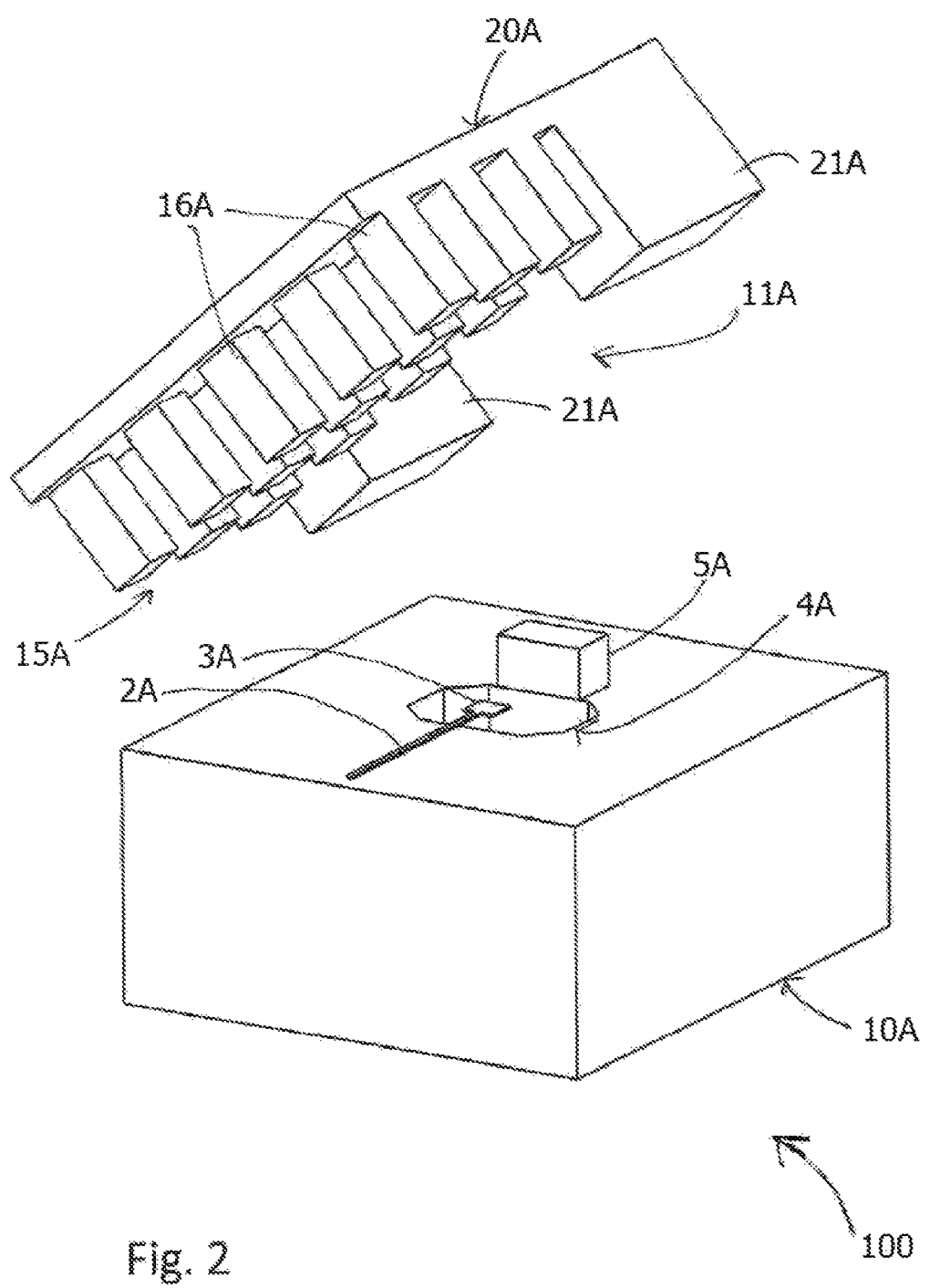
FIG. 2 shows the packaging structure of FIG. 1 with the substrate removed.

FIG. 2 shows the packaging structure 100 of FIG. 1, but with the chip or the MMIC substrate removed in order to more clearly show the cavity 4A, here having a hexagonal shape, and the position of the microstrip line 2A with the coupling section 3A, e.g. a probe, with respect to the cavity 4A opening. The coupling section 3A is located substantially at the center of the cavity 4A opening and the microstrip line 3A is disposed in the direction of the extension of the second transmission line 11A, here comprising the rectangular waveguide. At the side of the cavity 4A opening located opposite to the side at which the microstrip line 2A with the coupling section 3A is disposed, the small capacitive iris 5A is located. The other features have already been discussed with reference to FIG. 1.

Figure 3:
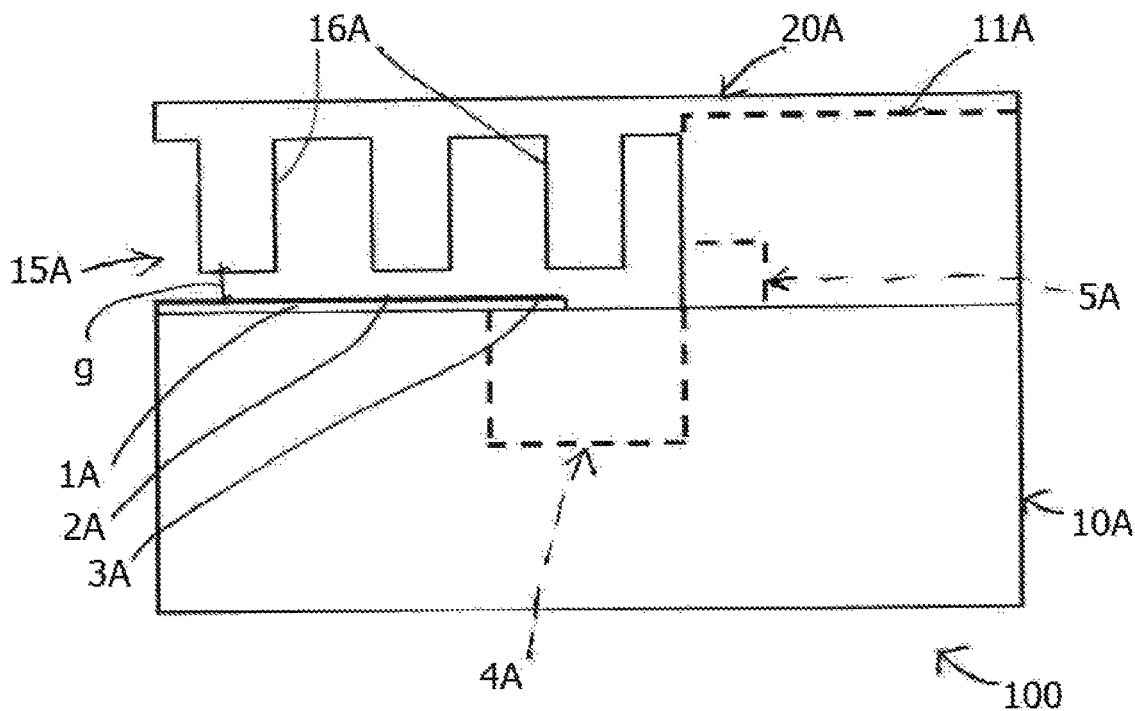
FIG. 3 is a side view of the packaging structure shown in FIG. 1 in an assembled state.

FIG. 3 is a schematic side view of the packaging structure 100 of FIG. 1, but in an assembled state. For illustrative purposes the cavity 4A, the iris 5A and the waveguide 11A between two block connecting sections or side walls 21A, 21A are illustrated by dashed lines since they are not visible in a side view. The coupling section 3A of the MMIC 1 microstrip line is located at the centre of the cavity 4A opening and the iris 5A is located at the end of the waveguide 11A, at the edge of the cavity 4A opening distant from the MIMIC 1A. The high impedance surface 15A comprising a plurality of pins 16A is located above the cavity 4A and the MIMIC 1A such that the gap g is formed between the surface formed by the outer ends of the pins 16A and the upper surface of the MMIC 1A and somewhat wider (also including the thickness of the substrate) at the waveguide side above the cavity opening. The gap has a height of about 0.25 wavelengths or less as also discussed above, seen between the lower ends of the pins and the upper surface of the MMIC substrate 1A.

It should be clear that the invention is not limited to three rows of pins 16A in a direction perpendicular to the transmission lines, or the transition; it can be more as well as fewer rows, and the high impedance surface can be provided for in many different manners, comprising different number of protrusions with different periodicity and dimensions etc. as also discussed above, and depending on the frequency band of interest.

Figure 4:
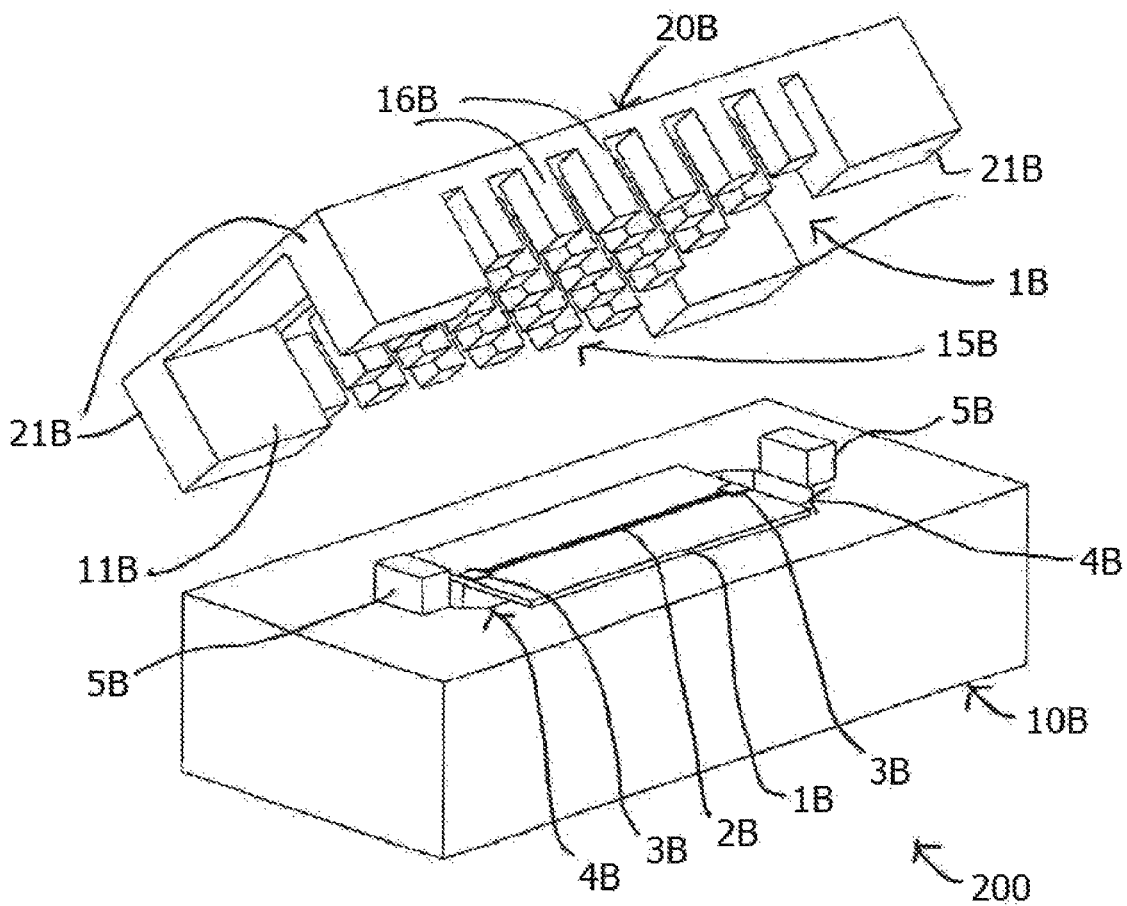
FIG. 4 is a view in perspective of a packaging structure in a non-assembled state according to a second embodiment which comprises a two-port, back-to-back, structure with two transitions between a circuit arrangement, an MMIC, and a rectangular waveguide.

FIG. 4 shows a two-port, back-to-back packaging structure 200 in a non-assembled state which comprises two transitions or interconnects between a circuit arrangement comprising an MMIC 1B and rectangular waveguides 11B, 11B. The functioning of the different features is similar to those described with reference to FIGS. 1-3, except that the structure comprises a two-port device, and similar features bear the same reference numerals, but are indexed "B", and will therefore not be described in detail. The MMIC, or the chip, 1B is integrated in the split-block assembly and is disposed on a first block section 10B and on opposite sides of the MMIC 1B transitions are provided to waveguides 11B,11B. A coupling section 3B,3B is connected to each MMIC microstrip line 2B for forming transitions to the waveguide sections 11B,11B as also described above with reference to e.g. FIG. 1. The first conducting block section 10B comprises two cavities 4B,4B above which the coupling sections 3B,3B are disposed as described more in detail above, and impedance matching elements e.g. comprising capacitive irises 5B, 5B are disposed adjacent the cavity 5B,5B openings as also discussed above. The split-block assembly comprises a second conducting block section 20B provided with or comprising a high impedance surface 15B which is located above the MMIC 1B and the two transitions in analogy to what has already been described with reference to FIGS. 1-3 for one transition, a single port implementation.

Figure 5:
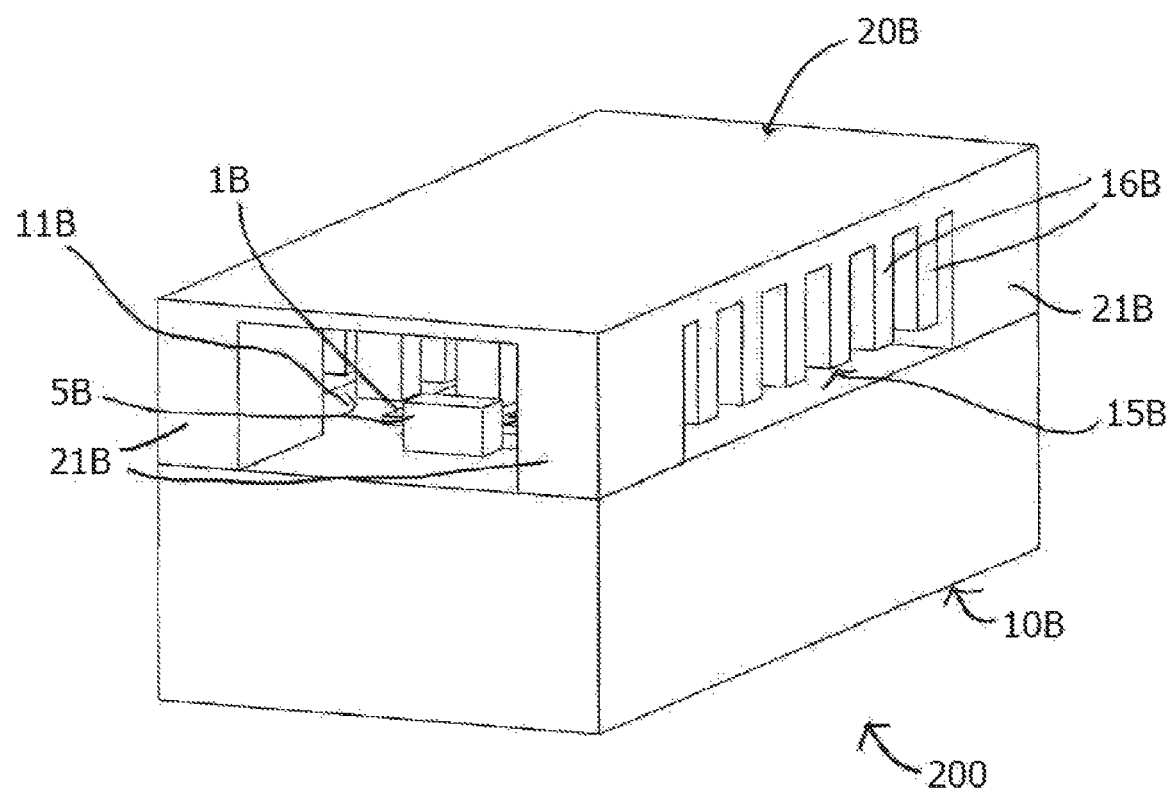
FIG. 5 shows the back-to-back packaging structure shown in FIG. 4 in an assembled state.

FIG. 5 schematically illustrates the back-to-back packaging structure 200 of FIG. 4 in an assembled state. The first and the second block sections 10B,20B can be mounted by any appropriate mounting or connection means, such as screws, bolts, magnets or similar (not shown), and any alignment pins which may be useful for assuring an accurate alignment between the blocks are also not shown, but mounting or connection means and alignment pins or similar should preferably be provided at the block connecting sections or waveguide side walls 21B,21B,21B,21B.

Figure 6:
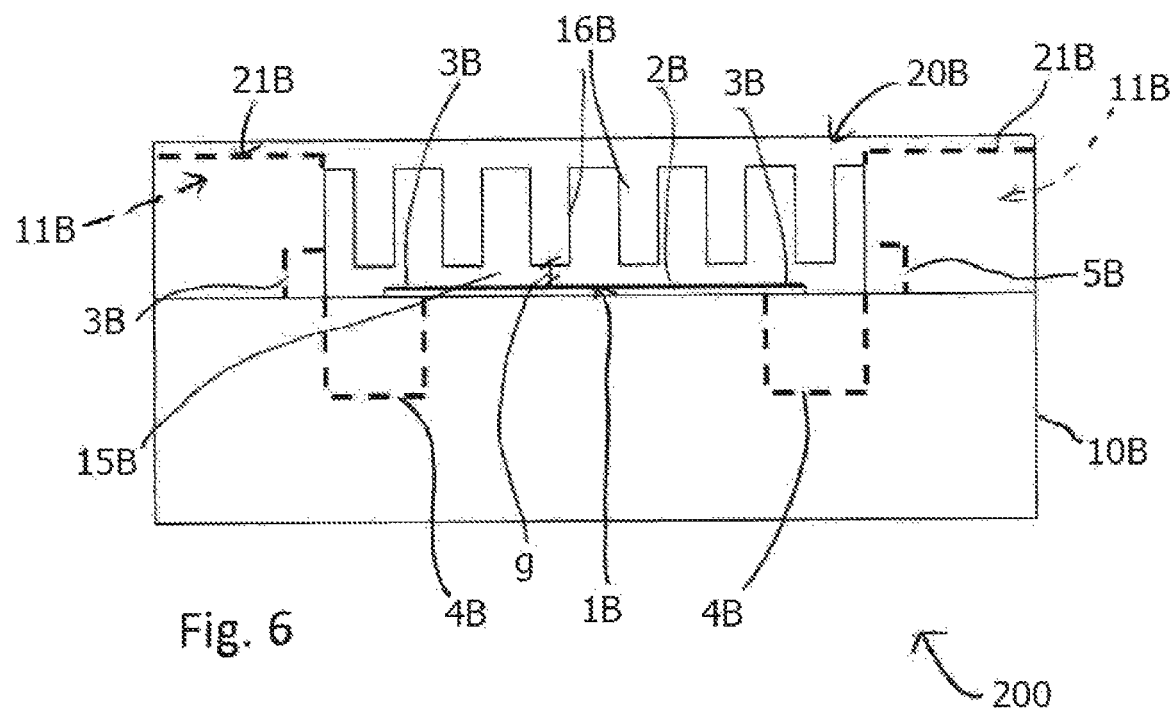
FIG. 6 is a side view of the back-to-back packaging structure shown in FIG. 5.

FIG. 6 is a schematic side view of the back-to-back packaging structure 200 shown in FIG. 5 with the cavities 4B,4B, the two capacitive irises 5B,5B being illustrated by dashed lines as in FIG. 3 which discloses a single port structure with one transition and similar features bear the same reference signs as in FIG. 3, but are indexed "B". It can be seen that the high impedance surface 15B faces the entire chip or MMIC substrate 1B and the cavities leaving an air gap g therebetween as discussed above. Since the features and functioning corresponds to that of the structure in FIG. 3 but for a two port structure, and it also can be varied in a corresponding manner, FIG. 6 will not be further discussed herein.

In the embodiments described with reference to FIGS. 1-6, the second transmission line is a rectangular waveguide. It should be clear, however, that the invention also covers other standard waveguides, e.g. ridge waveguides, circular waveguides, square-shaped waveguides etc. and hence, instead of rectangular waveguides 11, 11A,11A, there can be any other standard waveguide or waveguides (not shown).

Figure 7:
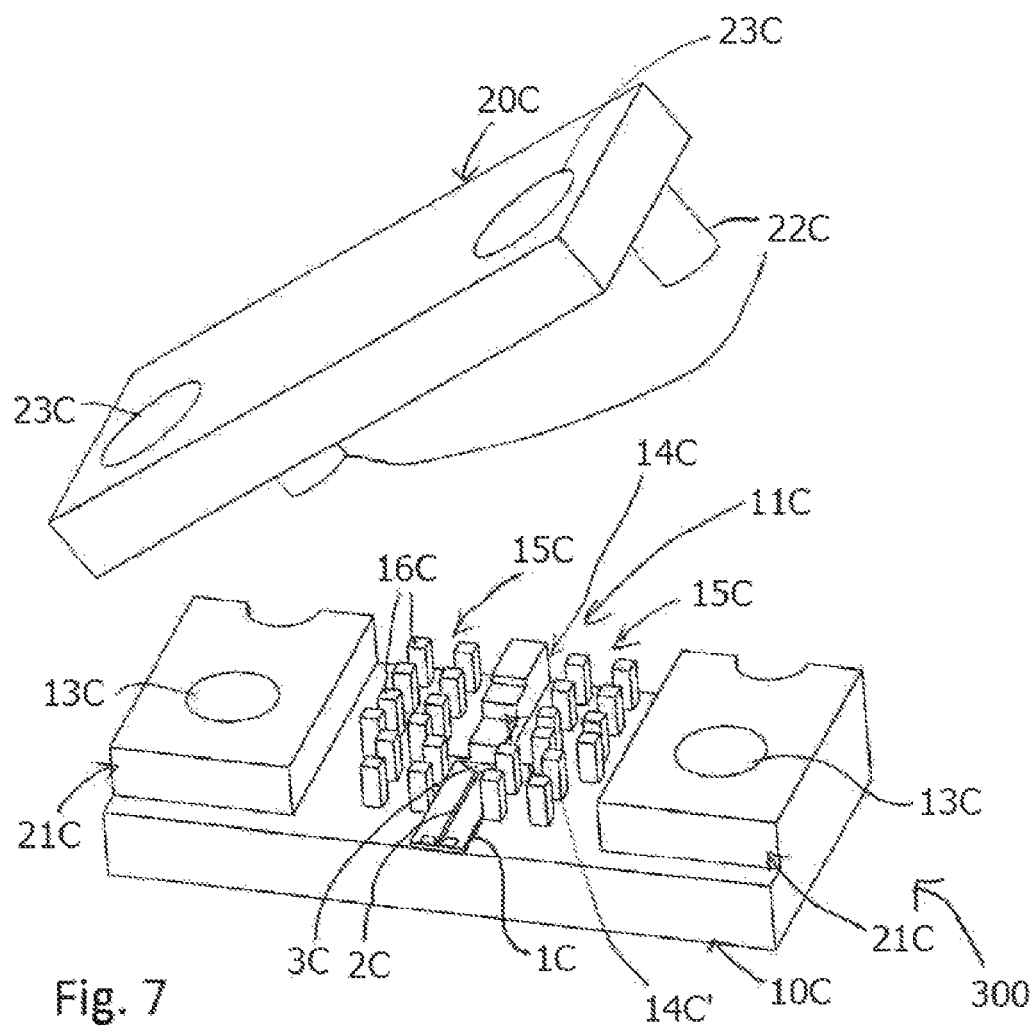
FIG. 7 is a view in perspective of a packaging structure, in a non-assembled state, according to a third embodiment which comprises a transition between a circuit arrangement, an MMIC, and a ridge gap waveguide.

FIG. 7 schematically illustrates a packaging structure 300 according to another embodiment of the invention which comprises an interconnection arrangement comprising a transition between a first transmission line, which comprises a microstrip line 2C of an MMIC 1C, and a ridge gap waveguide 11C, a rectangular waveguide with a ridge which here extends between, and in parallel to, the block connecting sections or waveguide side walls 21C,21C in a section of the first conducting block section 10B. The packaging structure 300 comprises a waveguide split block assembly in which the ridge gap waveguide 11C is formed by the first conducting block section 10C (here a bottom block), e.g. of solid metal or with a metalized surface, a second conducting block section 20C (here a top metal block) and the longitudinal conducting, e.g. of metal or metalized, the block connecting sections or side walls 21C,21C connected to or integral with either of the first and the second conducting block sections, here integral with the first 10C conducting block section 10C, at the waveguide section of the packaging structure 300.

The packaging structure 300 comprises a first transmission line comprising a microstrip line 2C of a circuit arrangement provided on a substrate, here an MMIC 1C which is integrated in the waveguide split block assembly formed by the first and second conducting blocks 10C,20C. As in the embodiments described above, the microstrip line 2C at an end is provided with a coupling section 3C for coupling the EM (electro-magnetic) field from the microstrip line 2C to the second transmission line in the transition, here the ridge gap waveguide 11C.

The split-block assembly is provided with at least one high impedance surface 15C or an AMC surface, e.g. comprising a periodic or a quasi-periodic structure, which here is formed by a plurality of pins 16C forming a pin-bed. In the embodiment of FIG. 7 the high impedance surface 15C is provided on the first block section 10C, surrounding a cavity 4C and the ridge 14C of the ridge gap waveguide 11C.

On the first block section 10C the substrate with the MIMIC 1 is disposed at an end opposite to the waveguide section and the coupling section 3C of the microstrip line 2C is located at an end section of the MMIC substrate 1C facing the waveguide section. Interconnection or securing elements (not shown) may comprise screws or similar adapted to be introduced into the screw holes 23C,13C for interconnection of the first and second block sections 10C,20C. Alignment pins 22C are advantageously used for assuring that the block sections 10C,20C are accurately aligned with respect to one another.

The functioning of the cavity 4C has also been described with reference to the embodiment described e.g. with reference to FIG. 1 and therefore will not be further described here. The MMIC 1C with the microstrip line coupling section 3C is so arranged with respect to the cavity 4C that the coupling section 3C is located above the cavity 4C as also discussed with reference to FIG. 1, and will face the bottom section of the second block section 20C in an assembled state.

At an end of the cavity 4C, opposite to the end where the coupling section 3C is located, the ridge gap waveguide 11C forming the second transmission line is arranged.

The cavity 4C or the hole has a depth of about $\lambda_g/4$ as also discussed in relation to the embodiment comprising a rectangular waveguide. The cavity 4C further has a size which exceeds the dimensions of the coupling section 3C, but apart from that it may have an arbitrary shape, e.g. rectangular, circular, oval, square-shaped, elliptical cross-section, and it may advantageously have a polygonal shape, e.g. hexagonal, as also discussed with reference to FIG. 1, which also is applicable for embodiments with a ridge gap waveguide.

One or more of the dimensions, e.g. the length defined as the dimension of the cavity in a direction orthogonal to the longitudinal extension of the waveguide, or perpendicularly to the transition, preferably is of the order of size of $\lambda_g/2$.

In an assembled state of the split block assembly, there will be a narrow gap g between the high impedance surface 15C, e.g. the outer free ends of the pins 16C or similar, and the bottom surface of the second block section 20C in the transition region, comprising the coupling section 3C, the MMIC 1C, the cavity (not visible in FIG. 7) and the ridge gap waveguide in the first block section 10C.

The second conducting block section 20C is arranged to act as a lid or a cover in an assembled state of the packaging structure 300c, and the transition of the interconnecting arrangement is hence contactless, without any galvanic contact between the first transmission line 2C, or the MMIC 1C, and the second transmission line comprising the ridge gap waveguide 11C, and between the first and second block sections in the transition region.

The first and second conducting blocks 10C,20C may be adapted to be mountable/demountable e.g. releasably interconnectable, or not.

The first planar transmission line, the microstrip of the MMIC 1C, the high impedance surface 15C, the dimensions of the gap between the high impedance surface etc., have already been discussed with reference to FIGS. 1-6, and will therefore not be further described with reference to embodiments concerning a transition to a ridge gap waveguide, as in FIGS. 7-10, since the same considerations apply.

The second transmission line here thus comprises a ridge gap waveguide 11C comprising a ridge 14C disposed in the first block section 10C and here also comprises an impedance transformer comprising a stair section 14C' comprising a number of steps (here a three-step Chebyshev transformer) connecting to the waveguide ridge 14C of the waveguide arrangement 11C e.g. ending with a waveguide port (not shown) at a location adjacent an outer end of the packaging structure 300 in an assembled state (not shown) of the two conducting block sections 10C,20C. To provide for the contactless transitions, the transformer section 14C' in the other end connecting to the ridge gap waveguide ends adjacent the cavity, which cannot be seen in FIG. 7, at an end opposite to the end of the cavity where the coupling section 3C of the first transmission line 2C is located and which extends, here, e.g. substantially halfway the opening of the cavity facing the end of the transformer section 14C'. As also referred to above, the coupling section may be located anywhere in the cavity opening.

Thus, according to the invention at least a quasi-planar, contactless transition or connection is provided between the first planar transmission line of the MMIC 10C and the ridge gap waveguide 11C.

It should also be clear that, alternatively, the ridge gap waveguide, the MMIC and the cavity and the high impedance surface may be provided on/in the second or top conducting block section 20C instead.

Figure 8:
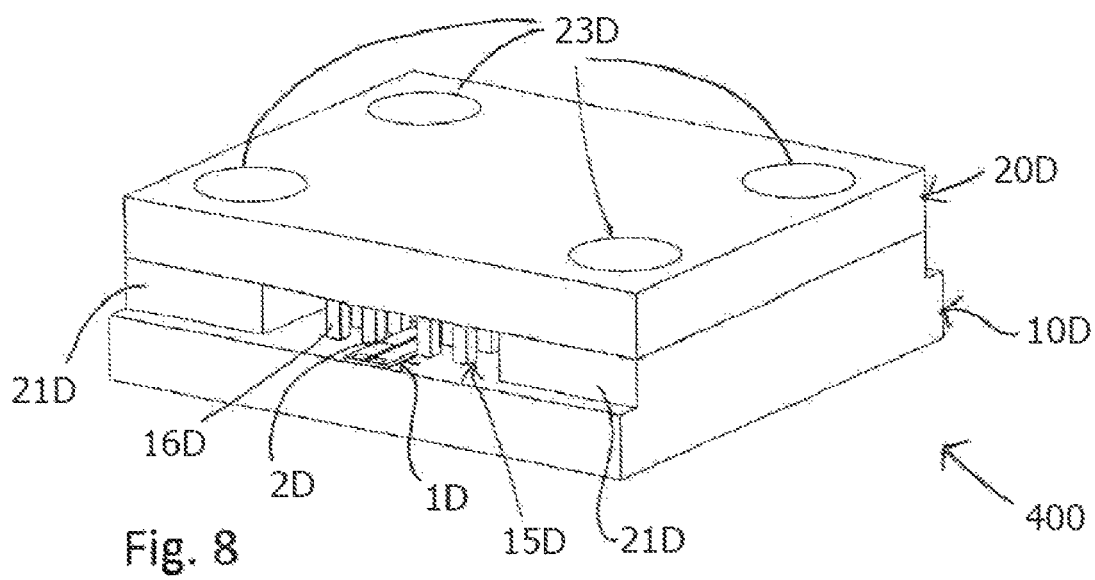
FIG. 8 is a view in perspective showing a fourth embodiment of a packaging structure in an assembled state which comprises a two-port, back-to-back structure with transitions between MMICs and a ridge gap waveguide.

FIG. 8 is a schematic view of a packaging structure 400 in an assembled state which comprises a back-to-back transition arrangement with two transitions between an MMIC 1D,1D and a ridge gap waveguide section respectively (not shown in FIG. 8). It comprises split block assembly with a first, here bottom, block section 10D on which two MMICs 1D with each a microstrip lines 2D (only one shown in FIG. 8) is arranged, and a second block section 20D. The first and second block sections may be interconnectable by means of interconnection or securing elements (not shown) e.g. screws or similar adapted to be introduced into the mounting holes 23D, . . . , 23D. Alignment pins are advantageously used for assuring that the block sections are accurately aligned with respect to one another. The interconnection or securing elements and the alignment pins have been thoroughly described with reference to FIG. 7 and similar considerations apply also for the back-to back-packaging structure 400. Part of a high impedance surface 15D of the first block section 10D can be seen.

Figure 9:
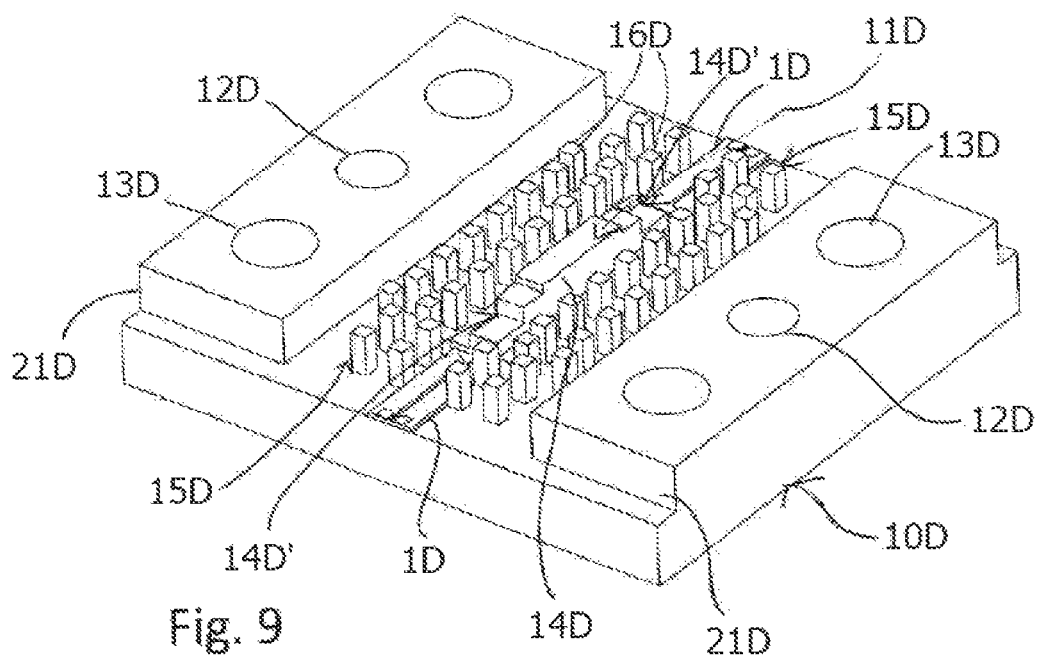
FIG. 9 is a view in perspective showing a first, here bottom, block section of the back-to-back MMIC-ridge gap waveguide packaging structure of FIG. 8.

FIG. 9 shows the packaging structure 400 of FIG. 8 with the second block section removed. On the first block section 10D MMICs 1D,1D with each a first transmission line 2D comprising a microstrip line are provided and a ridge gap waveguide 11D extends between, and in parallel to block connecting sections or side walls 21D,21D here integral with the first conducting block section 10D. For a more detailed description reference is made to the embodiment described in FIG. 7 referring to a single port transition arrangement which in other respects is similar to the dual-port, back-to-back implementation described with reference to FIGS. 8-10, and similar features and elements bear the same reference signs but are indexed "D".

The ridge gap waveguide 11D is thus formed by the first conducting block section 10D (here a bottom block), e.g. of solid metal or with a metalized surface, a second conducting block section (see FIG. 8) and the longitudinal conducting, e.g. of metal or metalized, block connecting sections or side walls 21D,21D here connected to the first conducting block section 10D by means of interconnecting elements (not shown) adapted to be introduced into mounting holes 23D, . . . 23D of the second block section (see FIG. 8) and corresponding mounting holes 13D, . . . 13D of the first block section 10D. Alignment holes 12D for alignment pins are also shown.

Each MMIC microstrip line 2D,2D, at a respective end portion thereof, is provided with a coupling section 3D,3D (see FIG. 10) for coupling the EM (electro-magnetic) field from the respective mictrostrip line 2D to the second transmission line, the ridge gap waveguide 11D.

The ridge gap waveguide 11D comprises a ridge 14D disposed on the first block section 10D and here comprises two impedance transformers, each comprising a stair section 14D' comprising a number of steps (here three-step Chebyshev transformers) connecting to the waveguide ridge 14D of the ridge waveguide arrangement 11D.

The microstrip lines 2D,2D are disposed at opposite ends of the ridge gap waveguide 11D and each coupling section 3D,3D (see FIG. 10) of the microstrip lines is located at an end section of the respective MMIC 1D,1D facing the ridge gap waveguide section.

The first block section 10D comprises a high impedance surface 15D or an AMC surface as described with reference to the preceding embodiments, surrounding two cavities 4D,4D (see FIG. 10), the ridge 14D of the ridge gap waveguide 11D and part of the MMICs.

Figure 10:
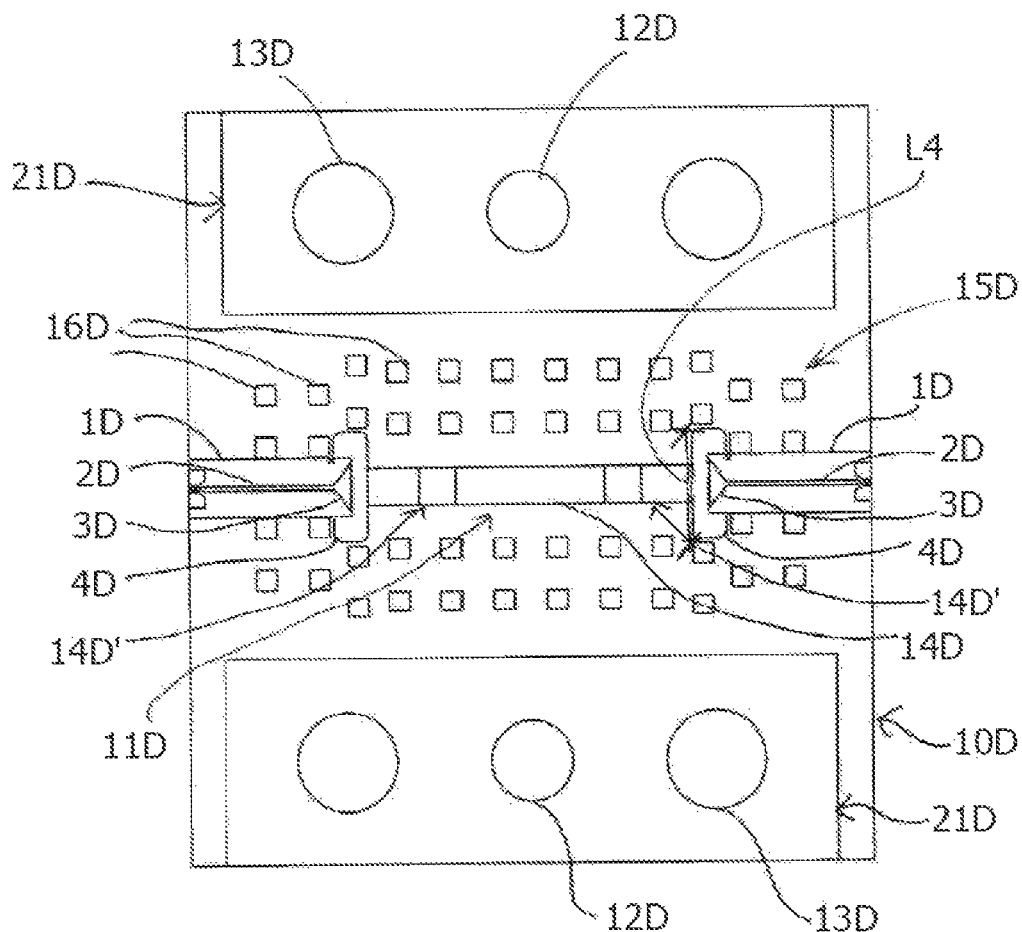
FIG. 10 is a top view of the first, bottom, section shown in FIG. 9.

FIG. 10 is a top view of the first block section 10D of FIG. 9. It can be seen that the coupling sections 3D,3D of the first transmission lines 2D,2D are located and extend substantially halfway the opening of the respective cavity 4D,4D in the plane of the upper surface of the first block section 10D facing the end of a respective transformer section 14D',14D' of the ridge gap waveguide 11D. As also discussed with reference to in particular FIG. 1, the cavities 4D,4D of the first block section 10D can be said to be arranged as integrated or internal back-shorts for the transitions between the microstrip lines 2D,2D and, in this embodiment, the ridge gap waveguide 11D, and act as half wavelength resonators.

Each cavity 4D,4D has a depth of about $\lambda_g/4$, i.e. substantially a quarter wavelength as also discussed in relation to the preceding embodiments. In the shown embodiment each cavity 4D has a length L4 of approximately $\lambda_g/2$ perpendicular to the extension of the ridge gap waveguide and the microstrips, and a width of about half the length or one third of the length. However, in alternative embodiments the cavity may have other dimensions and shapes, as long as the depth is substantially $\lambda_g/4$. Alternative cross-sectional shapes are also possible as discussed above.

In an assembled state of the split block assembly, there will be a slight or narrow gap g between the high impedance surface 15D, e.g. the outer free ends of the pins 16D or similar, and the bottom surface (the surface facing the first block section when assembled) of the second block section 20D (see FIG. 8) except for at the block connecting sections or side walls 21D,21D.

Thus, according to the invention a packaging structure with two contactless transitions or connections are provided between first planar transmission lines of MMICs and a ridge gap waveguide 11D is provided.

It should also be clear that, alternatively, the ridge gap waveguide, the MMICs, the cavities and the high impedance surface may be provided on/in the second or top conducting block section 20D instead, i.e. the blocks are inverted.

Figure 11:
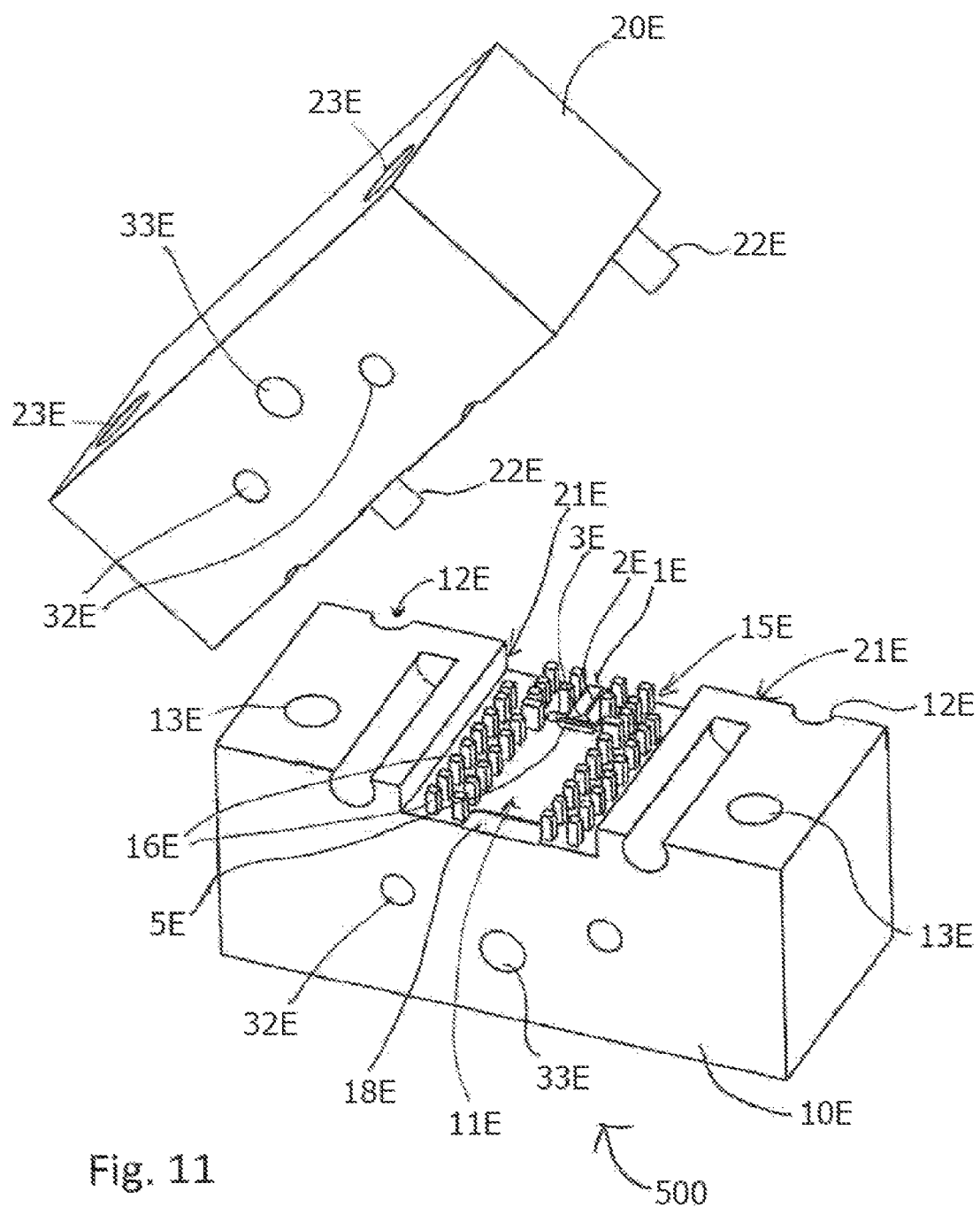
FIG. 11 is a view in perspective showing a fifth embodiment of a packaging structure in a non-assembled state which comprises a single port structure with a transition between a groove gap waveguide and an MMIC.

FIG. 11 schematically illustrates a packaging structure 500 according to a fifth embodiment of the invention which comprises an interconnection arrangement comprising a transition between a first transmission line, which comprises a microstrip line 2E of an MIMIC 1E, and a groove gap waveguide 11E which here extends between, and in parallel to, the metal walls 21E,21E of the first conducting block section 10E. The groove gap waveguide 11E is formed by the first conducting block section 10E, e.g. of solid metal or with a metalized surface as discussed above, a second conducting block section 20E (here a top metal block, see FIG. 14) and the longitudinal conducting block connecting sections or side walls 21E,21E here integral with the first conducting block sections 10E and adapted to be connected to the second block section when assembled e.g. by means of interconnection or securing elements (not shown) which may comprise screws or similar adapted to be introduced into the screw holes 23E,13E in the first and second block sections 10E,20E. Alignment pins 22E are advantageously used for assuring that the block sections are accurately aligned with respect to one another through introduction into alignment pin holes 12E,12E. In an alternative implementation the block connecting sections or side walls 21E,21E of the first and second block sections are soldered together upon assembly, or they can be interconnected by means of magnetic elements, which is applicable also for the other embodiments of the invention.

The microstrip line 2E of a circuit arrangement is provided on a substrate, here an MMIC 1E, or of a PCB, which is integrated in the waveguide split block assembly formed by the first and second conducting blocks 10E,20E. As in the embodiments described above, the microstrip line at an end is provided with a coupling section 3E for coupling the EM (electro-magnetic) field from the mictrostrip line to the groove gap waveguide 11E.

The split-block assembly is provided with a high impedance surface 15E, here formed by a plurality of pins 16E forming a pin-bed as described above. The high impedance surface 15E is provided on the first block section 10E, surrounding cavity 4E, the groove of the groove gap waveguide 11E and at least in part the MMIC 1D.

The MIMIC 1E, or a PCB, is disposed on a side of the cavity 4E opposite to the waveguide section and the coupling section 3E of the microstrip line 2E is located at an end section of the MMIC substrate 1E facing the waveguide section, which here preferably ends at a small capacitive iris 5E the functioning of which has been more thoroughly described with reference to FIG. 1.

The MMIC with the microstrip line coupling section 3E is so arranged with respect to the cavity 4E that the coupling section 3E will be located above the cavity 4E opening as also discussed with reference to FIG. 1 in the plane of the upper surface of the first block section 10E which will face the bottom section of the second block section 20E in an assembled state.

The cavity 4E or the hole has a depth of about $\lambda_g/4$, i.e. substantially a quarter wavelength as also discussed above. The options for the shape and dimensions of the cavity have been discussed with reference to the preceding embodiments and are applicable also for embodiments comprising one or more contactless transitions between an MIMIC or a PCB and a groove gap waveguide, and e.g. one or more of the dimensions, e.g. the length defined as the dimension of the cavity in a direction orthogonal to the longitudinal extension of the waveguide, or perpendicularly to the transition, preferably is of the order of size of $\lambda_g/2$, in the shown embodiment whereas the width e.g. may be about $\lambda_g/4$.

In an assembled state of the split block assembly, there is a narrow gap g between the high impedance surface 15E, which is arranged to surround the MMIC 1E, the groove gap waveguide and the cavity 4E in the first block section 10E, and the bottom surface of the second block section 20E as discussed more thoroughly with reference to the preceding embodiments. The pins 15E may e.g. be disposed in two rows along and adjacent the groove gap waveguide 11E, the MIMIC 1E and opposite short sides of the cavity 4E.

The second conducting block section 20E is arranged to act as a lid or a cover in an assembled state of the packaging structure 500, and the transition of the interconnecting arrangement is hence contactless, nor with any galvanic contact between the MMIC 1E or the PCB, and the second transmission line comprising the groove gap waveguide 11E, nor between the first and second block sections at the transition.

Features already having been discussed with reference to FIGS. 1-6 will not be further described with reference to embodiments concerning transitions to a groove gap waveguide, as in FIGS. 11-14, since the same considerations apply.

It should also be clear that, alternatively, the groove of the groove gap waveguide, the MIMIC, the cavity and the high impedance surface may be provided on/in the second or top conducting block 20E instead, the first block the acting as a cover.

The first and second block sections 10E,20E are here provided with connection holes 33E and alignment holes 32E for reception of interconnecting elements for connection to a waveguide flange (not shown) and for alignment pins (not shown) for proper alignment with respect to a waveguide flange. A flange matching step 18E may be provided for matching to a waveguide flange of a different dimension.

Figure 12:
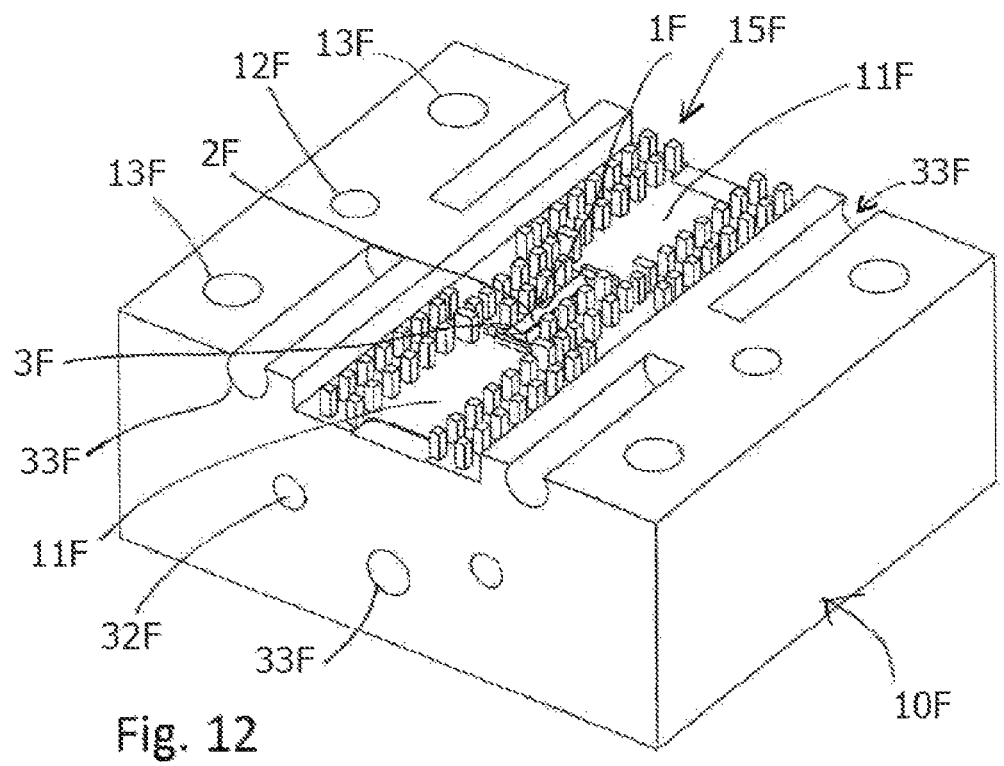
FIG. 12 is a view in perspective showing a sixth embodiment of a packaging structure in a non-assembled state, with the top block section removed, and which comprises a two-port back-to-back structure with transitions between an MMIC and groove gap waveguide sections.
Figure 13:
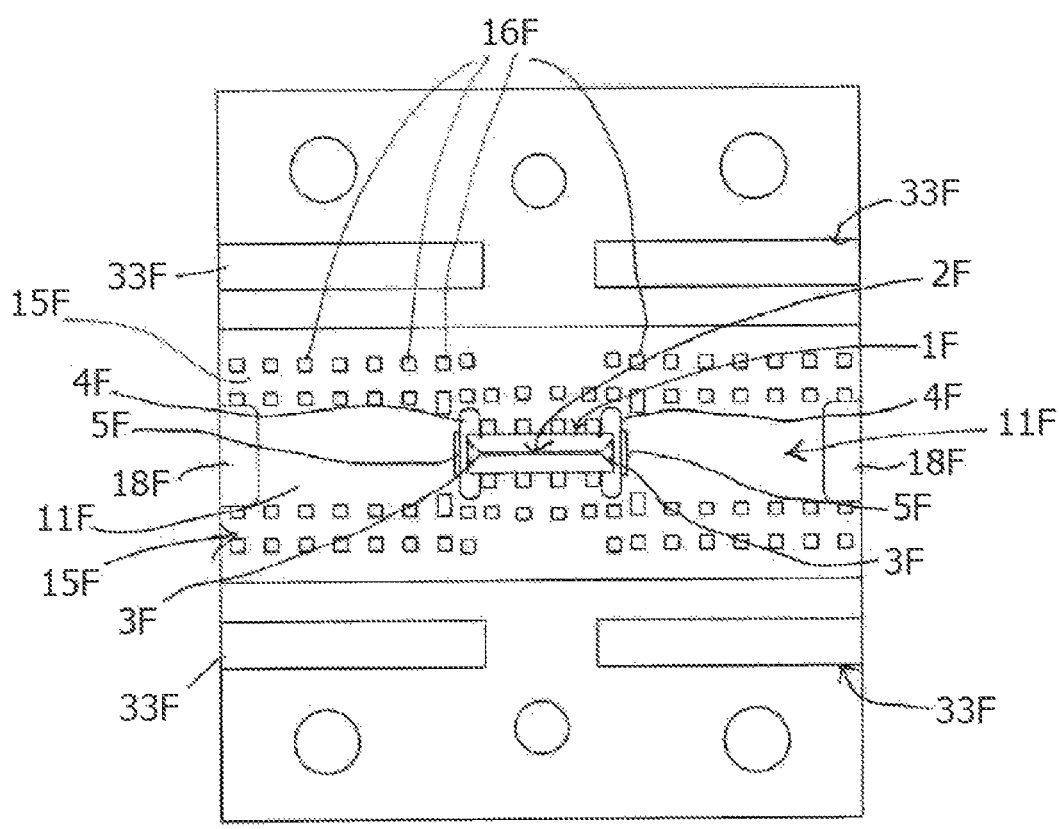
FIG. 13 is a top view of the first, bottom, section shown in FIG. 12.
Figure 14:
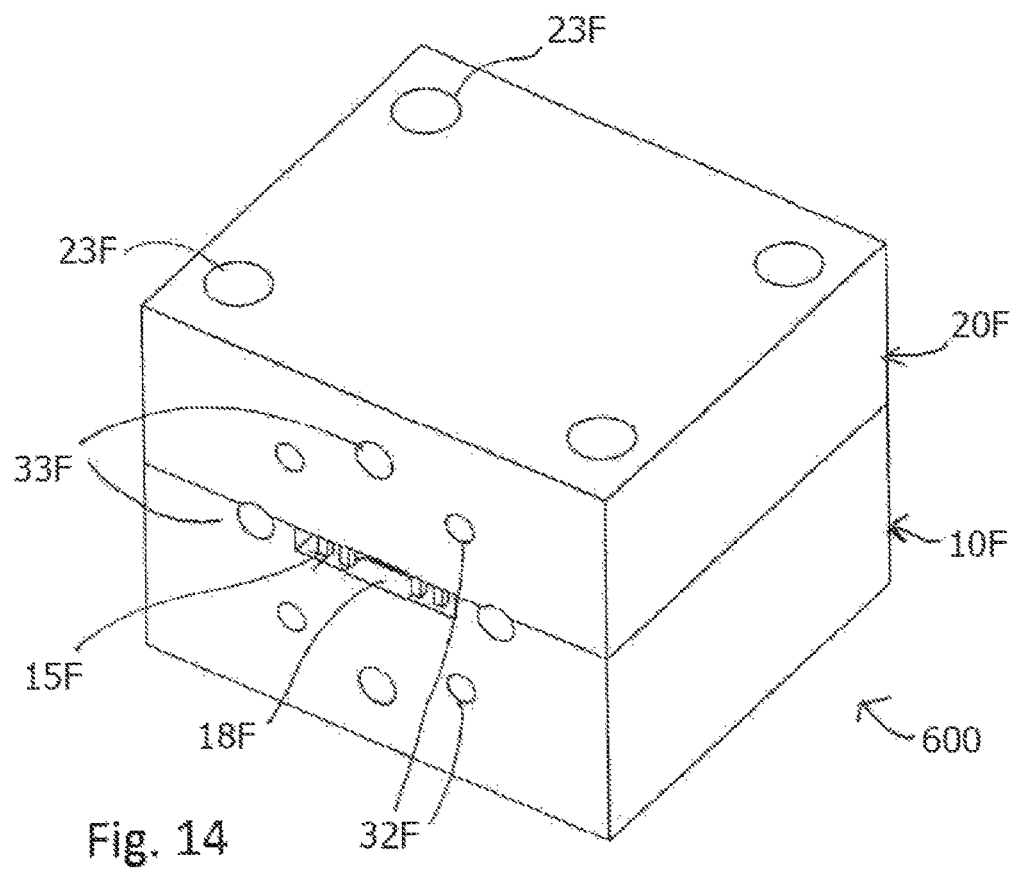
FIG. 14 is a schematic view showing a packaging structure as in FIG. 12 but in an assembled state.

FIG. 12 is a schematic view of a first block section 10F of a packaging structure 600 (packaging structure 600 in an assembled state can be seen in FIG. 14) which comprises a back-to-back transition arrangement with two transitions between an MMIC 1F and two groove gap waveguide sections. Elements similar to the elements of FIG. 11, which shows a one port implementation of a packaging structure comprising one transition between a groove gap waveguide and an MMIC or a PCB bear the same reference numerals, but are provided with an index "F" and will not be discussed in detail herein. The packaging structure 600 comprises a split block assembly with a first, bottom, block section 10F on which an MMIC 1F with a microstrip line 2F with two coupling sections 3F,3F (only one shown; see FIG. 13) is arranged, one for each a transition to a groove gap waveguide section 11F,11F, and a second block section 20F (see FIG. 14). The high impedance surface 15F of the first block section 10F is formed by pins 16F arranged in two rows adjacent the MMIC 1F, on either sides thereof in the waveguiding direction, and in two rows on either side along the waveguide sections and close to the short sides of the cavities 4F,4F which here are rectangular, with a length of about $\lambda_g/2$. It is in respect of the cavity dimensions referred to the description above of the other embodiments.

Small capacitive irises 5F,5F may be provided adjacent the cavities 4F,4F; cf the description relating to corresponding elements in FIG. 1 and in FIG. 11.

FIG. 13 is a top view of the first block section 10F of FIG. 12. Each groove gap waveguide section 14F ends, optionally with a capacitive iris 5F or some other impedance matching element, adjacent a cavity 4F opposite to the end of the opening of the respective cavity 4F where the coupling section 3F of a microstrip 2F is located and which into the opening of the cavity 4F.

Two groove gap waveguide sections 11F,11F are located at each an opposite side of a cavity 4F,4F opening.

Each cavity 4F,4F has a depth of about $\lambda_g/4$ as referred to above. In the shown embodiment each cavity 4F has a length L4 of approximately $\lambda_g/2$ perpendicular to the extension of the groove gap waveguide section 11F and a width of about two or three times the length. Reference is made to the description of the preceding embodiments as far as the cavity dimensions are concerned.

In an assembled state of the split block assembly, see FIG. 14, there is a slight or narrow gap g between the high impedance surface 15F and the bottom surface of the second block section 20F (see FIG. 14) except for at the block connecting sections or side walls 21F,21F, as also more thoroughly discussed above.

Thus, a packaging structure 600 with two contactless transitions between a first planar transmission line 1F of an MMIC and two groove gap waveguide sections 11F,11F is provided.

It should be clear that corresponding elements, dimensions etc. can be varied in a similar manner as described with reference to the preceding elements.

Figure 15:
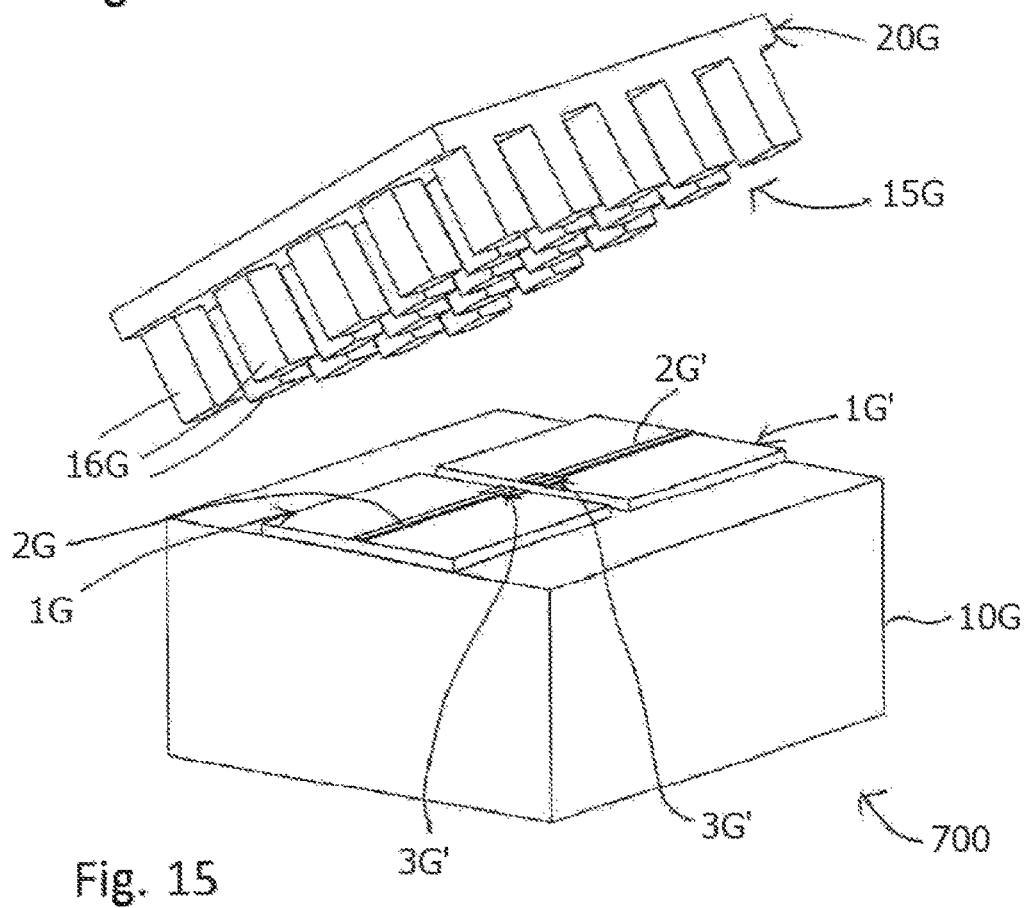
FIG. 15 is a view in perspective showing a seventh embodiment of a packaging structure in a non-assembled state which comprises a transition between two MMICs.

FIG. 15 shows a packaging structure 700 in a non-assembled state which comprises an interconnect between two MMICs 1G,1G'. It comprises a split-block assembly with a first conducting block section 10G and a second conducting block section 20G as also described with reference to the preceding embodiments and which therefore will not be further discussed here. On the first block section 10G two MMIC substrates or PCBs 1G,1G' are disposed at a slight distance from each other, e.g. between 100 µm and 300 µm or smaller or larger, said distance not being critical, and each with a microstrip line 2G,2G' forming a first and a second transmission line respectively. Each microstrip line is provided with a coupling section or probe 3G,3G' for coupling the field from a coupling section located at a respective end portion of a respective MMIC to the other. The coupling sections 3G,3G' are located opposite to, and facing, one another with the slight distance there between. The coupling sections 3G,3G' are located above a cavity 4G in the first block section 10G which has a depth of about $\lambda_g/4$, as referred to with reference to the other embodiments, similar elements being indexed "G". The cavity 4G may also here have a polygonal shape, e.g. hexagonal, but it may also e.g. have a rectangular, circular, square-shaped, elliptical cross-section, one or more of the dimensions, e.g. the length defined as the dimension of the cavity in a direction orthogonal to the longitudinal extension of the transmission lines 2G,2G', or perpendicularly to the transition, preferably being of the order of size of $\lambda_g/2$.

The second block section 20G comprises wall sections e.g. with holes (not shown) for reception of connecting or fastening elements (also not shown) for connection to the first conduction block section 10G. The wall sections may alternatively be connected to, or integral with, the first block section 10G. Instead of any separate connecting or fastening elements, the first and second block sections may be soldered together upon assembly. The connecting elements may alternatively comprise permanent magnets. The second block section 20G also comprises a high impedance surfaces 15G as described in a more detailed manner with reference to FIG. 1. Also as described earlier, in an assembled state, there will be a slight gap, much smaller than $\lambda_g/4$, e.g. about $\lambda_g/10$ in some implementations, between the lower end portions of protruding elements 16G, e.g. pins or similar and the microstrips 2G,2G' on the MMICs.

Figure 16:
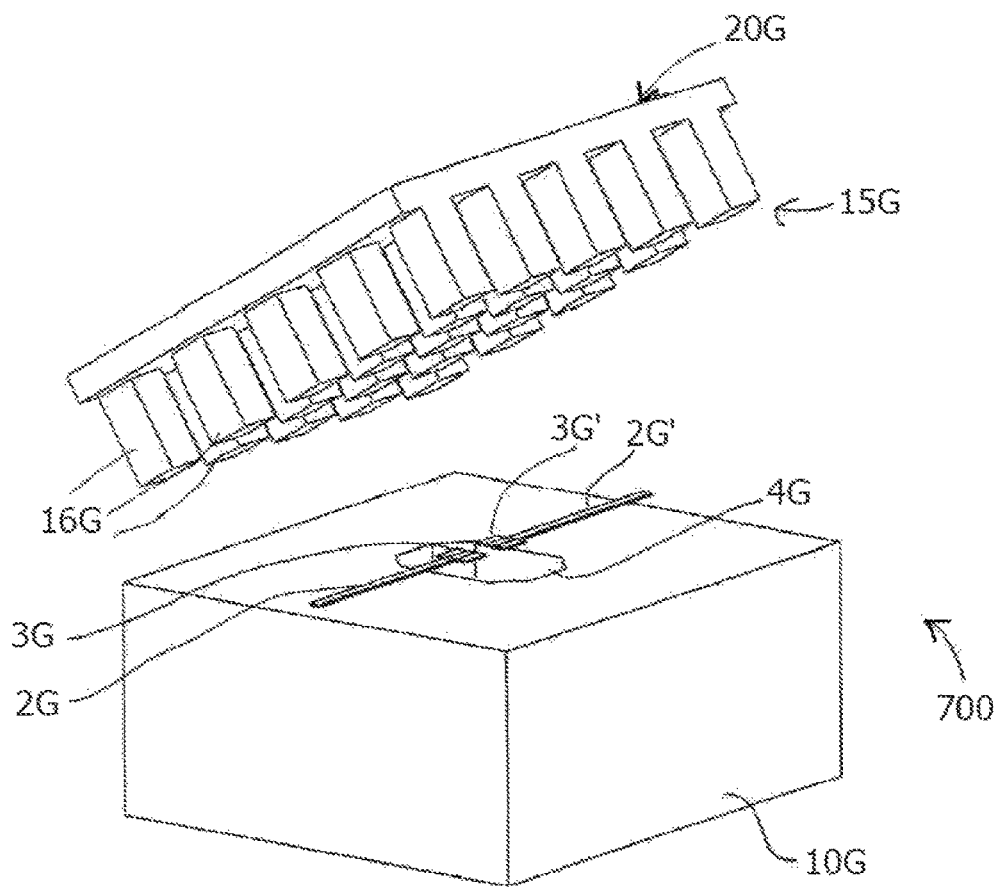
FIG. 16 is a view in perspective of the packaging structure of FIG. 15 but with the substrate removed.

FIG. 16 shows the first block section 10G of FIG. 15 with the MMIC substrate removed for purposes of illustrating the hexagonal cavity 4G.

Figure 17:
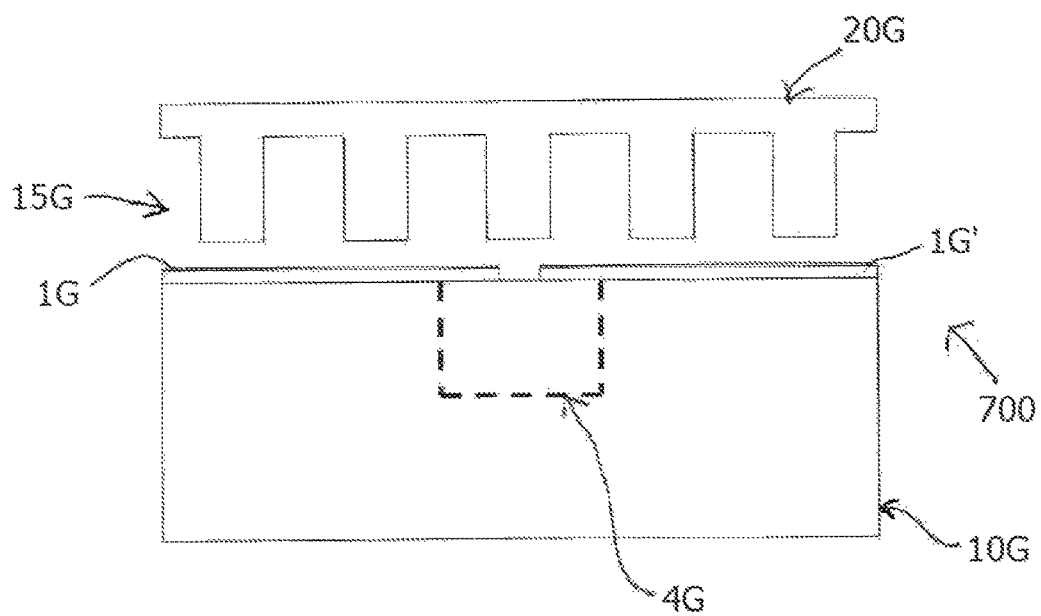
FIG. 17 is a side view of the MIMIC-MIMIC connection of FIG. 15.

FIG. 17 is a side view of the packaging structure 700 of FIG. 15 with the contours of the cavity 4G indicated through dashed lines.

Figure 18:
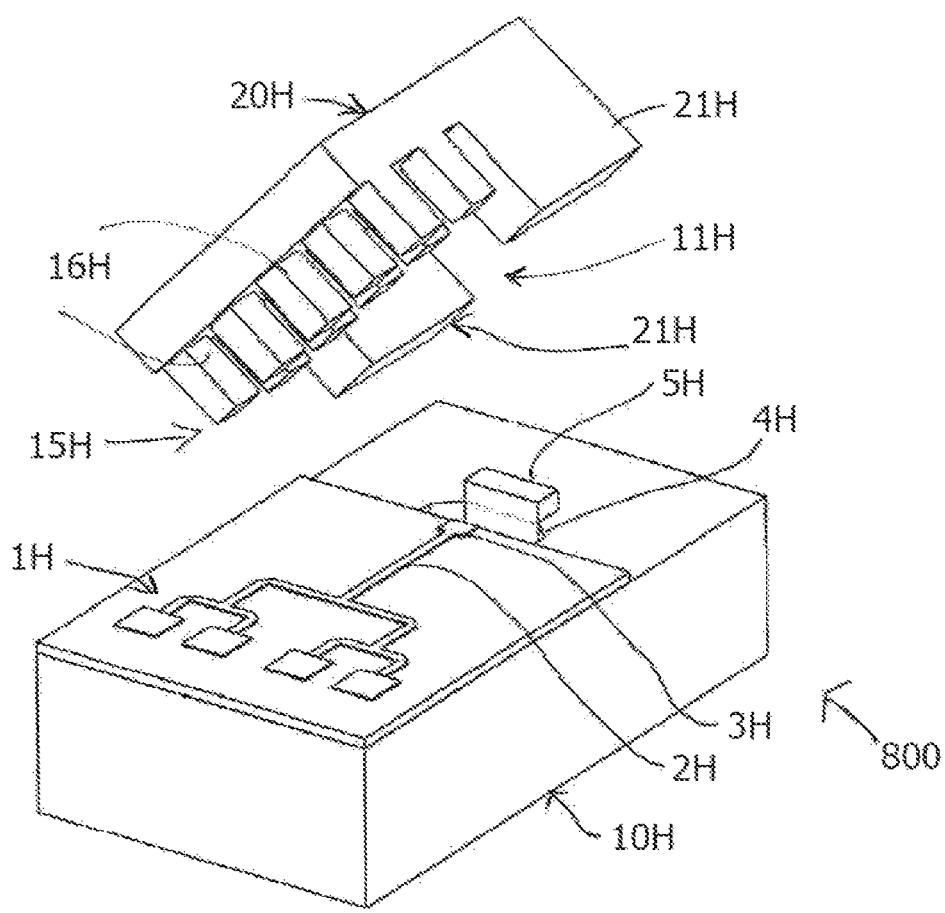
FIG. 18 is a view of a packaging structure comprising a transition between an on-chip antenna and a waveguide in a non-assembled state.
Figure 19:
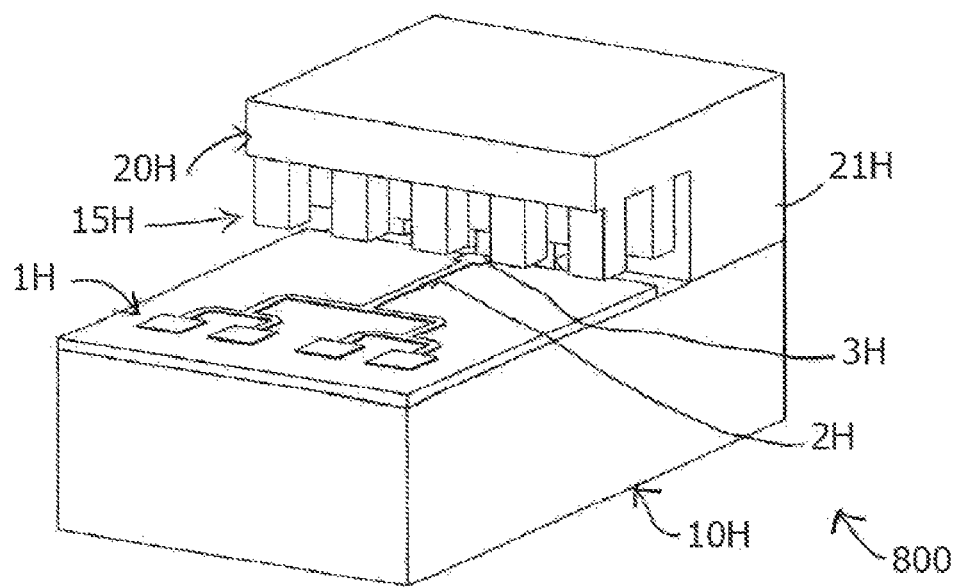
FIG. 19 is a view in perspective showing the packaging structure of FIG. 18 in an assembled state, e.g. for performing measurements of the on-chip antenna.

FIG. 18 is a schematic illustration of a packaging structure 800, in a non-assembled state, providing an interconnect between an on-chip antenna 1H and a waveguide 11H. As in the preceding embodiments the packaging structure 800 comprises a split-block assembly comprising a first block section 10H on which a circuit arrangement, here comprising an on-chip antenna 1H with a microstrip line 2H with a coupling section 3H. The first block section 10G comprises a cavity 4H with a depth of about $\lambda_g/4$ as also discussed above, above which the coupling section 3H is located, and a waveguide section 11H formed between interconnecting side sections or walls 21H,21H here integral, in one piece, with the first block section 10H. Preferably a capacitive iris 5H or some other impedance matching element is provided at the edge of the cavity 4H opening opposite to the coupling section 3H as also discussed with reference to the preceding embodiments. As described for example with reference to the embodiment illustrated in FIG. 1, the second block section 20H, acting as a lid or a cover, is provided with a high impedance surface 15H. The first and/or second waveguide blocks 10H,20H may comprise standard-flange waveguide matching steps (not shown).

The packaging structure 800 may e.g. be used for testing the on-chip antenna 1H (or any other DUT (device under test)), e.g. for making on-wafer measurements. It therefore also comprises a waveguide interface where the waveguide structure 11H is connected to a flange, the ports, of an analysing or measuring instrument, e.g. a VNA (Vector Network Analyser). The waveguide 11H will then directly excite the DUT, here the on-chip antenna 1H.

Thus, through the contactless transition, the contactless coupling section or probe, of the present invention, coupling of waves from the DUT, here the on-chip antenna 1H, to the measuring arrangement, e.g. a VNA, (not shown) is enabled via capacitive proximity coupling rather than through direct electrical contact, which is extremely advantageous. The electrical properties of a measuring arrangement comprising a packaging structure 800 are unique e.g. in that radiation from the probe is eliminated, and an extremely flexible mechanical solution is provided for measurements of different devices in the mm-wave and in the sub-mm wave regions, and even in the microwave region.

It is a particular advantage that through the invention resonance free, low-loss contactless MMIC-waveguide or MMIC-MMIC interconnects can be provided.

It is also an advantage that a new measurement set-up, and high frequency probes, are provided facilitating e.g. on-wafer measurements of electronic devices and on-chip antennas.

It should be clear that the invention is not limited to the specifically illustrated embodiments, but that it can be varied in a number of ways within the scope of the appended claims.

Particularly it is applicable for different circuit arrangements, in principle any kind of circuit arrangement, e.g. a high (RF) frequency package comprising a circuit arrangement, such as an MMIC (Monolithic Micro/Millimetre-wave Integrated Circuit) or any other circuit arrangement, e.g. wherein one or several MMICs or hybrid circuits are connected, or mounted on a carrier substrate, MMICs, PCBs of different sizes, active or passive, and it is not limited to any specific frequencies, but is of particular advantage for high frequencies, above 60-70 GHz, but also useful for frequencies down to about 25-30 GHz, or even lower, although it is generally most advantageous for higher frequencies where the problems initially discussed are more pronounced, and for lower frequencies larger cavities are needed. A packaging structure may also comprise one, two, three, four or more ports serving as input and/or output ports; several input/outputs and/or several MMICs and/or waveguides. The invention covers different types of planar transitions, e.g. also comprising coplanar transmission lines.

Although in all the illustrated embodiments the first conducting block portions are taken to form a bottom section, it should be clear that, in alternative embodiments, the block section disposition may be different, e.g. reverted.

The invention is not limited to any specific circuitry, and supporting electronics is not shown for reasons of clarity and since it does not form part of the main inventive concept.

The invention claimed is:

1. A high frequency packaging structure comprising:
   at least one transition between a first transmission line and a second transmission line,
   said first transmission line being a planar transmission line,
   a split-block assembly with a first conducting block section and a second conducting block section and at least one input/output port,
   said first transmission line is arranged on a substrate or forms part of a circuit arrangement arranged on a substrate disposed on the first conducting block section and comprises or is connected to a coupling section,
   the first conducting block section further, for the, or each, transition, comprises a cavity with a cavity opening in an upper surface of the first conducting block section and said first transmission line is so arranged that the coupling section will be located in the cavity opening in an assembled state of the split-block assembly,
   said second transmission line being arranged in line with said first transmission line on an opposite side of the cavity opening for providing a transition between said first and second transmission lines,
   the second conducting block section is arranged to act as a lid or a cover in an assembled state of the high frequency packaging structure,
   one of the conducting block sections is provided with a high impedance surface or an AMC surface arranged along or facing said first and second transmission lines at the transition, and
   there being a narrow gap between the high impedance surface or the AMC surface and an opposing surface of the other conducting block section in the assembled state of the split-block assembly at least in the transition region such that the, or each, transition between said first transmission line and said second transmission line being contactless without any galvanic contact between said first transmission line and said second transmission line.

2. The high frequency packaging structure according to claim 1, wherein the cavity has a depth has a depth of about $\lambda_g/4$.

3. The high frequency packaging structure according to claim 1, wherein the, or each, cavity has an opening in the plane of the block section in which it is provided, the size of which exceeds the dimensions of the coupling section or sections, and in that the coupling section protrudes from one end of the cavity opening and protrudes into the cavity opening, the second transmission line being located adjacent an opposite end of the cavity opening, or entering the cavity opening from the opposite end such that there is a slight distance between the coupling section of the first transmission line and the second transmission line, or a coupling section of the second transmission line.

4. The high frequency packaging structure according to claim 1, wherein the cavity has a rectangular, circular, square-shaped, elliptical cross-section or similar, the dimensions of which being of the order of size of $\lambda_g/2$, or that the cavity has a polygonal shape, the dimensions of which being of the order of size of $\lambda_g/2$.

5. The high frequency packaging structure according to claim 1, wherein the first and second conducting block sections are adapted to be mountable/demountable or releasably interconnectable by means of interconnecting means, such as screws or similar, and hence are possible to assemble/disassemble, alignment means optionally being provided for assisting in aligning the first and second conducting block sections when assembled.

6. The high frequency packaging structure according to claim 1, wherein the, or each, substrate comprises a dielectric substrate and in that the, or each, substrate is shaped to comprise an opening or a hole substantially of the same planar dimensions as the cavity opening in the first block section and which is co-located therewith, or that the substrate is shaped in an arbitrary manner while extending under the coupling section, or that that the dielectric substrate is intact without any corresponding opening or hole or shaping and protrudes into the cavity opening a same distance as the coupling section.

7. The high frequency packaging structure according to claim 1, wherein the high impedance surface or the AMC surface comprises a periodic or a quasi-periodic structure comprising a pin structure with a plurality of pins, corrugations or similar of metal which are arranged to form a bed of pins, corrugations or similar, the pins, corrugations or similar of the periodic or quasi-periodic structure having dimensions adapted for a specific, selected, frequency band, blocking all other modes the gap being smaller than $\lambda_g/4$ and in that the gap is an air gap or a gap at least partly filled with a dielectric material.

8. The high frequency packaging structure according to claim 1, wherein the, or each, coupling section is adapted to couple an EM-field from the first transmission line to the second transmission line, that the, or each, cavity being adapted to act as a half-wavelength resonator.

9. The high frequency packaging structure according to claim 1, wherein the first transmission line comprises a microstrip line of a circuit arrangement comprising a Monolithic Micro/Millimetre-wave Integrated Circuit (MMIC), and the second transmission line comprises a waveguide, the high frequency packaging structure comprising at least one contactless transition between the circuit arrangement comprising the MMIC and the waveguide, the waveguide comprising a rectangular waveguide, a ridge waveguide, a circular waveguide or a square waveguide or any other standard waveguide.

10. The high frequency packaging structure according to claim 9, wherein it the high frequency packaging structure comprises a back-to-back structure with two transitions between each a waveguide section and the circuit arrangement comprising the MMIC.

11. The high frequency packaging structure according to claim 9, wherein the high impedance surface is provided on the second block section and arranged such as to, in an assembled state of the packaging structure, face the circuit arrangement comprising the MMIC and the transition provided above the cavity, the first transmission line comprising a microstrip line with a coupling section for the, or each, transition.

12. The high frequency packaging structure according to claim 11, wherein an impedance matching element is disposed at the end of the or each waveguide section on the first block section, adjacent the, or each, cavity.

13. The high frequency packaging structure according to claim 9, wherein the, or each, waveguide comprises a ridge gap waveguide section provided in the first block section, the, or each, ridge gap waveguide comprising a Chebyshev transformer or an impedance matching transition section connected to the ridge adjacent a respective cavity.

14. The high frequency packaging structure according to claim 13, wherein the high impedance surface is provided on the first block section and is arranged such as to extend along the at least one ridge gap waveguide section on either sides thereof, the cavity or the cavities and at least partially along the sides of the MMIC in the, or each, transition region, the, or each, first transmission line comprising a microstrip line on the MMIC provided with or connected to a coupling section for the, or each, transition, and in that block connecting sections or waveguide side walls are provided on the first and/or the second block section to allow assembly of the first and second block sections while leaving a said gap between the high impedance surface and a surface of the opposing block section.

15. The high frequency packaging structure according to claim 9, wherein the high impedance surface is provided on the second block section along, and on either side of the, or each, ridge gap waveguide section, the cavity or the cavities and at least partially along opposite outer side edges of the or each MMIC in a direction of propagation, that the high impedance surface comprises full-height pin elements or corrugations, or that the first and the second block sections each are provided with partial-height pin elements, such that two opposing pin elements or corrugation on each a block section together form a full height pin element or corrugation.

16. The high frequency packaging structure according to claim 9, wherein the, or each, waveguide comprises a groove gap waveguide section provided in the first block section.

17. The high frequency packaging structure according to claim 16, wherein an impedance matching element, e.g. a matching iris, is disposed at the end of the or each groove gap waveguide section of the first block section adjacent the, or each, cavity.

18. The high frequency packaging structure according to claim 17, wherein that the high impedance surface comprising protruding pin elements, is provided on the first block section and is arranged such as to extend throughout a transition region formed by the regions along the at least one groove gap waveguide section on either long sides thereof, along the substrate with the circuit arrangement comprising the MMIC with the first transmission line comprising a microstrip line with at least one coupling section, and at least on two substantially opposite sides surround the transition region, block connecting sections being provided on the first and/or the second block sections such as to allow assembly of the first and second block sections while assuring the presence of the gap between the opposing block sections in the high impedance surface region and the transition region, or that the high impedance surface is provided on the second block section along, on either side of, the, or each, groove gap waveguide comprising full-height pin elements or corrugations, or that the first and the second block sections each are provided with partial-height pin elements, such that two opposing pin elements or corrugation on each a block section together form a full height pin element or corrugation.

19. The high frequency packaging structure according to claim 1, wherein the first transmission line comprises a microstrip line of a circuit arrangement comprising an MMIC provided on a substrate and that the second transmission line also comprises a microstrip line of a circuit arrangement comprising an MMIC provided on a substrate, the packaging structure hence comprising a contactless transition between two circuit arrangements comprising MMICs or PCBs provided on a substrate, the first and second microstrip lines being provided with a respective coupling section.

20. The high frequency packaging structure according to claim 19, wherein the high impedance surface is provided on the second block section and is arranged to, in an assembled state of the packaging structure, face the coupling sections located above, and substantially in the plane of the opening of the cavity, and at least a major part of the substrates with the circuit arrangements comprising the MMICs.

21. The high frequency packaging structure according to claim 1, wherein the at least one transition comprises a transition between a circuit arrangement on a substrate comprising an electronic device or an on-chip antenna to be tested, a DUT (Device Under Test) comprising the first planar transmission line and a waveguide forming the second transmission line, and in that it further comprises a waveguide interface or a waveguide flange for connection to an analysing arrangement.

22. The high frequency packaging structure according to claim 1, wherein the high frequency packaging structure is adapted to be used for high RF-frequency signals.

23. An interconnection arrangement for providing a connection to electronic devices to be measured or tested, comprising a packaging structure according to claim 1, comprising a contactless transition and being adapted to be used as a contactless probe for coupling the first transmission line with a coupling section of a circuit arrangement comprising a device under test arranged on a substrate or an on-chip antenna, to a waveguide, said waveguide comprising a waveguide interface for connection to a waveguide flange of a measurement equipment.

24. A method of using an interconnection arrangement according to claim 23, comprising performing on-wafer measurements of electronic devices comprising Devices Under Test (DUTs) or on-chip antennas.

* * * * *